US006558869B1

(12) United States Patent
McCullough et al.

(10) Patent No.: US 6,558,869 B1
(45) **Date of Patent: *May 6, 2003**

(54) PATTERN FORMATION

(75) Inventors: Christopher David McCullough, Fort Collins, CO (US); Kevin Barry Ray, Leeds (GB); Alan Stanley Monk, Cheshire (GB); John David Riches, West Yorkshire (GB); Anthony Paul Kitson, West Yorkshire (GB); Gareth Rhodri Parsons, West Yorkshire (GB); David Stephen Riley, West Yorkshire (GB); Peter Andrew Reath Bennett, West Yorkshire (GB); Richard David Hoare, Whitley Bay (GB); James Laurence Mulligan, West Yorkshire (GB); John Andrew Hearson, West Yorkshire (GB); Carole-Anne Smith, Edinburgh (GB); Stuart Bayes, West Yorkshire (GB); Mark John Spowage, Normanton (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/558,110

(22) Filed: Apr. 25, 2000

Related U.S. Application Data

(63) Continuation of application No. PCT/GB98/03189, filed on Oct. 26, 1998.

(30) Foreign Application Priority Data

Oct. 29, 1997 (GB) ............................................ 9722862

(51) Int. Cl.[7] ............................................... G03F 7/039

(52) U.S. Cl. ............................... 430/270.1; 430/281.1; 430/286.1; 430/302; 430/303; 430/311; 430/325; 430/326; 430/348; 430/944; 430/945; 430/964

(58) Field of Search .......................... 430/270.1, 281.1, 430/286.1, 302, 303, 311, 325, 348, 326, 944, 945, 964

(56) References Cited

U.S. PATENT DOCUMENTS

| | | | | | |
|---|---|---|---|---|---|
| 4,510,227 | A | | 4/1985 | Mohr et al. | 430/175 |
| 4,942,111 | A | * | 7/1990 | Wade et al. | 430/273 |
| 5,015,554 | A | | 5/1991 | Ruckert et al. | 430/270 |
| 5,264,318 | A | | 11/1993 | Yabe et al. | 430/175 |
| 5,340,699 | A | * | 8/1994 | Haley et al. | 430/302 |
| 5,541,263 | A | | 7/1996 | Thackeray et al. | 525/328.8 |
| 5,585,223 | A | | 12/1996 | Fréchet et al. | 430/296 |
| 5,858,626 | A | * | 1/1999 | Sheriff et al. | 430/326 |
| 6,060,222 | A | * | 5/2000 | West et al. | 430/326 |
| 6,074,802 | A | * | 6/2000 | Murata et al. | 430/270.1 |
| 6,083,662 | A | * | 7/2000 | Miller et al. | 430/302 |
| 6,090,532 | A | * | 7/2000 | West et al. | 430/326 |
| 6,110,646 | A | * | 8/2000 | Urano et al. | 430/302 |
| 6,117,610 | A | * | 9/2000 | Sheriff et al. | 430/190 |
| 6,130,026 | A | * | 10/2000 | Bennett et al. | 430/303 |
| 6,136,499 | A | * | 10/2000 | Goodall et al. | 430/270.1 |
| 6,143,471 | A | * | 11/2000 | Takata et al. | 430/281.1 |
| 6,192,799 | B1 | | 2/2001 | Van Damme et al. | 101/457 |
| 6,200,727 | B1 | * | 3/2001 | Urano et al. | 430/270.1 |

(List continued on next page.)

FOREIGN PATENT DOCUMENTS

| | | | |
|---|---|---|---|
| EP | 0564389 | | 10/1993 |
| EP | 0720057 | | 7/1996 |
| EP | 0742490 | | 11/1996 |
| EP | 0764522 | | 3/1997 |
| EP | 823327 | | 5/1997 |
| EP | 864420 | | 9/1998 |
| GB | 1245924 | | 9/1971 |
| GB | 1266612 | | 3/1972 |
| JP | 411119428 | * | 4/1999 |
| WO | WO 9842507 | | 10/1988 |
| WO | 9739894 | | 10/1997 |
| WO | WO-99/08879 A1 | * | 2/1999 |
| WO | WO-99/21715 A1 | * | 5/1999 |

OTHER PUBLICATIONS

WPI/Derwent Publication Abstract No. 90–152541 of JP8800251217, Apr. 10, 1990, 1 page.

*Primary Examiner*—Janet Baxter
*Assistant Examiner*—Barbara Gilliam
(74) *Attorney, Agent, or Firm*—Faegre & Benson LLP

(57) ABSTRACT

This invention is directed to a precursor for preparing a resist pattern by heat mode imaging, the precursor comprising a heat sensitive composition, the solubility of which in an aqueous alkaline developer is arranged to increase in heated areas, and a means for increasing the resistance of non-heated areas of the heat sensitive composition to dissolution in an aqueous alkaline developer (the "developer resistance means"), wherein said developer resistance means comprises one or more compounds selected from the group consisting of:

(A) compounds which include a poly(alkylene oxide) unit;

(B) siloxanes; and (C) esters, ethers and amides of polyhydric alcohols, wherein said heat-sensitive composition comprises an aqueous alkaline developer soluble polymeric substance (i.e. the "active polymer") and a compound which reduces the aqueous alkaline developer solubility of the polymeric substance (i.e. the "reversible insolubilizer compound") such that the aqueous alkaline developer solubility of the composition is increased on heating and the aqueous alkaline developer solubility of the composition is not increased by incident UV radiation. The invention provides a solution to the problem of the relatively narrow solubility differential between imaged and non-imaged areas of heat sensitive positive working radiation sensitive compositions.

39 Claims, No Drawings

U.S. PATENT DOCUMENTS 6,251,559 B1 * 6/2001 Huang et al. ............ 430/270.1
6,300,038 B1 * 10/2001 Shimazu et al. ......... 430/270.1
6,326,122 B1 * 12/2001 Nagasaka et al. ........ 430/270.1
6,352,811 B1 * 3/2002 Patel et al. .............. 430/270.1
6,358,669 B1 * 3/2002 Savariar-Hauck et al. ........................ 430/273.1
6,461,765 B1 * 10/2002 McCullough et al. ....... 430/302
2001/0001701 A1 5/2001 Van Damme et al. ... 430/271.1
2002/0001771 A1 * 1/2002 Yates et al. .............. 430/270.1

* cited by examiner

PATTERN FORMATION

CROSS-REFERENCE TO RELATED APPLICATION

This application is a continuation of application PCT/GB98/03189, filed Oct. 26, 1998, published in English, which in turn claims priority from GB application 9722862.1, filed Oct. 29, 1997.

This invention relates to the formation of a resist pattern in the preparation of, for example, a planographic, especially a lithographic, printing member or electronic parts such as printed circuits, or masks. Particularly, although not exclusively, there is described a precursor for preparing a resist pattern; a method of preparing a said precursor; a method of preparing a resist pattern; a formulation; a kit; and a printing member.

Lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophilic or oleophobic and image areas may be oleophilic.

A conventional lithographic printing member precursor has a light sensitive coating over an aluminium support. Negative working lithographic printing member precursors have a radiation sensitive coating which when imagewise exposed to light hardens in the exposed areas. On development, the non-exposed areas of the coating are removed leaving the image. On the other hand, positive working lithographic printing member precursors have a radiation sensitive coating which, after imagewise exposure to light, has exposed areas which are more soluble in a developer than non-exposed areas. This light induced solubility differential is called photosolubilisation. A large number of commercially available positive working printing member precursors coated with quinone diazides together with a phenolic coated with quinone diazides together with a phenolic resin work by photosolubilisation to produce an image. In both cases the image area on the printing member itself is ink-receptive or oleophilic and the non-image area or background is water receptive or hydrophilic.

In addition to quinone diazides/phenolic resins, conventional positive working light sensitive compositions may include minor amounts of additives which are arranged to cause small changes in selected properties of the compositions. For example, additives are known for improving the quality and/or uniformity of a process for coating light sensitive compositions on a support; for improving resistance of compositions to white light fogging or to processing chemicals (e.g. isopropyl alcohol, UV ink, plate cleaner etc); and for improving ink adhesion to a form surface at the start of printing. Any effect such additives may have on the solubility of the compositions is small and/or incidental.

Recent developments in the field of lithographic printing form precursors have resulted in radiation-sensitive compositions useful for the preparation of direct laser addressable printing form precursors. Digital imaging information can be used to image the printing form precursor without the need to utilise an imaging master such as a photographic transparency.

U.S. Pat. No. 5,491,046 (Kodak) describes a laser addressable printing member precursor which, it is stated, can be utilised as a direct positive working system. The patent describes a radiation induced decomposition of a latent Bronsted acid to increase the solubility of a resin matrix on imagewise exposure.

In general, the quinone diazide/phenolic resin conventional positive working light sensitive precursors described above comprise a composition which is inherently generally very insoluble in alkaline developers. Thus, non-exposed areas have a relatively low tendency to dissolve in developer during development, yet UV exposure still renders the exposed areas developer soluble. However, heat sensitive positive working precursors generally have quite different chemistries and may comprise a composition which has a much higher solubility in alkaline developers. As a result, the solubility differential between exposed and non-exposed areas in laser addressable precursors is much narrower than for conventional precursors. Consequently, development of laser addressable precursors must be carried out under strictly controlled conditions, whereas conventional precursors can be developed under a relatively wide range of conditions.

To the Applicant's knowledge, the only commercially available printing member precursor which uses an IR laser to affect the relative solubilities of exposed and non-exposed areas to provide a printing member is a negative working precursor of a type described in U.S. Pat. No. 5,491,046, referred to above. No laser addressable positive working precursors (described in U.S. Pat. No. 5,491,046 or elsewhere) are commercially available. One of the reasons for this may be due to the narrow solubility differentials between exposed and non-exposed areas in the positive working compositions proposed. However, the aforementioned patent neither addresses, solves or provides any insight or comment into the problem of the relatively narrow solubility differential between imaged and non-imaged areas of heat sensitive positive working radiation sensitive compositions. It is an object of the present invention to address this problem.

The types of electronic parts whose manufacture may use a radiation sensitive composition include printed wiring boards (PWBs), thick-and thin-film circuits, comprising passive elements such as resistors, capacitors and inductors; multichip devices (MDCs); integrated circuits (ICs); and active semiconductor devices. The electronic parts may suitably comprise conductors, for example copper board; semiconductors, for example silicon or germanium; and insulators, for example silica as a surface layer with silicon beneath, with the silica being selectively etched away to expose portions of the silicon beneath (a step in the manufacture of e.g. field effect transistors). In relation to masks, a required pattern may be formed in the coating on the mask precursor, for example a plastics film, which is then used in a later processing step, in forming a pattern on, for example, a printing or electronic part substrate.

The invention is based on the discovery that certain additives which have little or no effect on the solubility differential between imaged and non-imaged areas in conventional light sensitive printing member precursors have a surprisingly large and advantageous effect on the solubility differential between imaged and non-imaged areas of heat-sensitive positive radiation sensitive compositions.

According to a first aspect of the present invention, there is provided a precursor for preparing a resist pattern by heat mode imaging, the precursor comprising a heat sensitive composition, the solubility of which in an aqueous developer is arranged to increase in heated areas, and a means for increasing the resistance of non-heated areas of the heat sensitive composition to dissolution in an aqueous developer (hereinafter the "developer resistance means"), wherein said developer resistance means comprises one or more compounds selected from the groups comprising:

(A) compounds which include a poly(alkylene oxide) unit;

(B) siloxanes; and (C) esters, ethers and amides of polyhydric alcohols.

Developer resistance means of the type described have been found, surprisingly, to provide a relatively large increase in the resistance of non-heated areas to developer compared to the resistance when no developer resistance means is present. For example, there may be at least a 50% increase in the time taken for a first heat sensitive composition containing a said developer resistance means to completely dissolve in a developer (e.g. a typical commercially available positive lithographic plate developer) compared to the time taken for complete dissolution of a heat sensitive composition which does not contain said developer resistance means but is in all other respects identical to said first heat sensitive composition. In some embodiments, the increase may be greater than 65% or even greater than 80%. Preferably developer resistance means of the present invention do not have acid labile groups. Preferably the composition does not produce an acid on heat mode imaging.

Said developer resistance means is preferably non-ionic. It is preferably a surfactant.

Unless otherwise stated in relation to the developer resistance means, an alkyl group may have up to 12, suitably up to 10, preferably up to 8, more preferably up to 6, especially up to 4 carbon atoms.

Unless otherwise stated in relation to the developer resistance means, where any group is stated to be "optionally-substituted", it may be substituted by one or more: halogen atoms, especially fluorine, chlorine or bromine atoms; hydroxy or cyano groups; carboxyl groups or carboxy derivatives, for example carboxylic acid salts; and optionally-substituted alkyl, alkenyl, alkynyl, alkoxy, amino, sulphinyl, sulphonyl, sulphonate and carbonyl groups.

Compounds in group (A) may include a unit of formula $$[—C_rH_{2r}—O—]_y \qquad I$$

wherein r is an integer in the range 2 to 5 and y is an integer in the range 2 to 5,000. The moiety $—C_rH_{2r}—$ may include straight or branched chains.

Preferably, r represents 2 or 3. Where r represents 3, said unit of formula I may represent a 1- or, preferably, a 2-oxypropylene unit.

Suitably, y is less than 500, is preferably less than 350, is more preferably less than 200 and, especially, is less than 100.

Examples of compounds in group (A) include the following, wherein R represents a hydrogen atom or an optionally-substituted, preferably an unsubstituted, alkyl or phenyl group; l represents 0 to 3, preferably 1; z is suitably less than 500, is preferably less than 350, is more preferably less than 200 and, especially, is less than 100: polyethylene glycol $HO—(CH_2CH_2O—)_y—H$; polyoxyalkylene alkyl ether $RO(C_rH_{2r}O)_yH$; polyoxyalkylene alkyl esters; polyoxyalkylene alkylphenyl ether

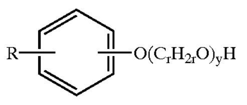

polyoxyethylene polystyrylphenyl ether

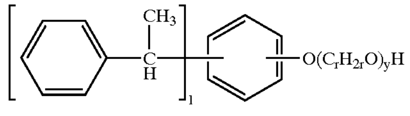

polyoxyethylene-polypropylene glycol

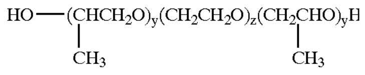

(including both block polymers and random polymers); polyoxyethylene-polyoxypropylene alkyl ether (forming alkyl ether at the end of the molecule; including random polymers);

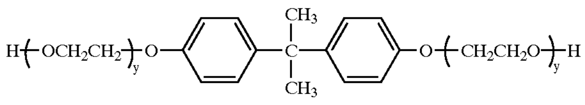

ethylene oxide derivatives of alkylphenol-formaldehyde condensate

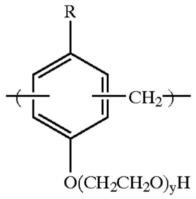

polyoxyethylene-polyhydric alcohol fatty acid partial esters such as

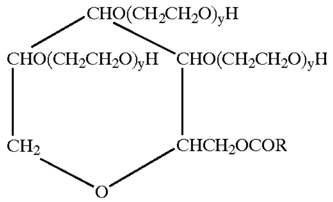

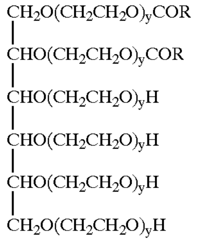

polyoxyethylene fatty acid esters such as $RCOO(CH_2CH_2O)_yH$; polyoxyethylene alkyl amines

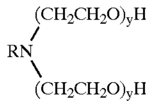

an alkylene oxide adduct of castor oil, hardened castor oil, lanolin, lanolin alcohol, beeswax phytosterol or phytostanol;

and polyoxyalkylene sorbitol fatty acid esters and/or ethers, for example sorbitol fatty acids or of polyoxypropylene sorbitol fatty acids or of polyoxyethylene-polyoxypropylene sorbitol fatty acids.

Preferably, compounds of group (A) are selected from polyoxyethylene sorbitol hexastearate, polyoxyethylene sorbitol tetrastearate, polyoxyethylene sorbitol tetraoleate, polyoxyethylene sorbitol hexaoleate, polyoxyethylene sorbitol monooleate, polyoxyethylene sorbitol monolaurate, polyoxyethylene sorbitol tetralaurate, polyoxyethylene sorbitol hexalaurate, polyoxypropylene sorbitol hexastearate, polyoxypropylene sorbitol tetraoleate, polyoxypropylene sorbitol hexaoleate, polyoxypropylene sorbitol monolaurate, polyoxyethylene-polyoxypropylene sorbitol hexastearate, polyoxyethylene-polyoxypropylene sorbitol tetrastearate, polyoxyethylene-polyoxypropylene sorbitol monooleate, polyoxyethylene-polyoxypropylene sorbitol. tetraoleate, polyoxyethylene sorbitol hexastearyl ether, polyoxyethylene sorbitol tetrastearyl ether, polyoxyethylene sorbitol tetraoleyl ether, polyoxyethylene sorbitol monolauryl ether and polyoxyethylene sorbitol monooleyl ether, polyoxyethylene lauryl ether, polyoxyethylene cetyl ether, polyoxyethylene stearyl ether, polyoxyethylene oleyl ether, polyoxyethylene higher alcohol ether, polyoxyethylene octylphenyl ether, polyoxyethylene nonylphenyl ether; polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbitol tetraoleate, polyethylene glycol monooleate, polyethylene glycol distearate, polyoxyethylene nonylphenyl ether-formaldehyde condensate, oxyethylene-oxypropylene block copolymer, polyethylene glycol, tetraethylene glycol, polyoxyethylene stearyl ether, polyoxyethylene sorbitol lauryl ester, and polyoxyethylene castor oil Compounds in group (B) include siloxanes substituted by one or more optionally-substituted alkyl or phenyl groups. Said siloxane may be linear, cyclic or complex cross-linked. Preferred siloxanes are phenylalkylsiloxanes and dialkylsiloxanes.

Preferred compounds in group (B) include a unit of formula

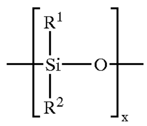

wherein $R^1$ and $R^2$ independently represent an optionally-substituted, especially an unsubstituted, alkyl or phenyl group and x represents an integer.

x may be at least 2, preferably at least 10, more preferably at least 20. x may be less than 100, preferably less than 60.

Compounds in group (B) may be polysiloxanes which include units of formula I and II. The molecular weights of such polysiloxanes may be in the range 1800 to 40,000, preferably in the range 3500 to 16000. Preferred polysiloxanes include a copolymer of dimethyldichlorosilane, ethylene oxide and propylene oxide suitably having a viscosity of 9 $cm^2$/second at 25° C. and a surface tension of 18 mN/m; a copolymer of dimethyldichlorosilane and ethylene oxide, suitably comprising about 15 to 25 siloxane units and 50 to 70 oxyethylene units in each molecule and having an average molecular weight of about 5,000; a copolymer of dimethyldichlorosilane and propylene oxide having an average molecular weight of 7,000; and a copolymer containing in its molecule 25 to 40 dimethylsiloxane units, 120 to 150 oxyethylene units and 80 to 100 oxypropylene units and having an average molecular weight of about 13,500.

Compounds in group (C) include esters, ethers and amides of polyhydric alcohols. Preferred polyhydric alcohols are of general formula $$C_sH_{s+2}(OH)_s$$

wherein s is in the range 2 to 20, preferably 4 to 10. An especially preferred polyhydric alcohol is sorbitol.

Compounds in group (C) may include esters, ethers and amides of polyhydric alcohols and moieties having 2 to 30, preferably 4 to 25, more preferably 6 to 20 carbon atoms. Preferred esters are selected from laurates, palmitates, stearates and oleates. Preferred ethers are selected from lauryl, cetyl, stearyl, oleyl and phenyl ethers. Preferred amides are fatty acid alkanolamides, with lauryl ethanolamide being especially preferred.

Compounds in group (C) may comprise any of the compounds described above for group A, but excluding the polyalkylene oxide unit of such compounds. Preferably a compound in group (C) used in the present invention is not a diester of a methane diol or of a mono-substituted methane diol.

Said heat sensitive composition and said developer resistance means of said precursor may not necessarily, together, define a single homogeneous layer. Said precursor may include at least some developer resistance means at or towards an upper surface thereof.

Whilst the applicants do not wish to be limited by any theoretical explanation of how their invention operates, it is believed that the presence of at least part of the developer resistance means at an uppermost surface of the precursor may be a key factor. Thus, preferably, the precursor includes an upper surface (which is suitably contacted by developer during development) which includes some of said developer resistance means. Such a surface may be a component of a layer which also includes said heat sensitive composition. In this case, the precursor may be prepared using a mixture comprising said heat sensitive composition and said developer resistance means. It is believed that, at some stage, at least part of the developer resistance means separates from the heat sensitive composition and migrates to the surface. Thus, resistance to developer attack appears to be manifested particularly at the surface of precursors of the present invention. Dynamic contact angle studies (using a Cahn Dynamic Contact Angle Analyzer) have clearly showed a marked effect at the surface of precursors described herein. For example, a typical positive working lithographic printing plate precursor has advancing and receding contact angles in water of approximately 95° and 48° respectively, whereas a precursor comprising a heat sensitive composition and a developer resistance means of, for example, a phenyl methyl polysiloxane (applied to the substrate as a mixture) has advancing and receding contact angles in water of approximately 95° and 67° respectively. A surface of the same phenyl methyl polysiloxane alone provided on the same substrate has advancing and receding contact angles in water of approximately 95° and 67° respectively. Thus, the surface of the precursor is of a nature similar to that of the polysiloxane coated as a single component.

Where the developer resistance means is provided in a single layer with the heat sensitive composition and/or in a separate layer, the sum of the amounts of compounds selected from groups (A), (B) or (C) in said single layer and a said separate layer may be at least 0.3 wt %, suitably at least 1 wt %, preferably at least 1.5 wt %, more preferably at least 2 wt %, especially at least 3 wt %. The sum of the amounts may be 10 wt % or less, suitably 8 wt % or less, preferably 7 wt % or less, more preferably 6 wt % or less.

The heat sensitive compositions of the present invention are heat-sensitive in that localised heating of the compositions, preferably by suitable radiation, causes an increase in the aqueous developer solubility of the exposed areas.

Said heat sensitive composition preferably includes a polymeric substance which is preferably a resin. Said polymeric substance preferably includes —OH groups. It is preferably a phenolic resin and is, more preferably, a novolak resin.

Novolak resins are useful in this invention, suitably being condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare those phenolic resins generally known as novolaks which are thermoplastic in character. Higher aldehyde:phenol ratios of more then 1:1 to 3:1, and a basic catalyst would give rise to a class of phenolic resins known as resoles, and these are characterised by their ability to be thermally hardened at elevated temperatures.

The active polymer may be a phenolic resin. Particularly useful phenolic resins in this invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolak resins, resole resins and novolak/resole resin mixtures. Examples of suitable novolak resins have the following general structure

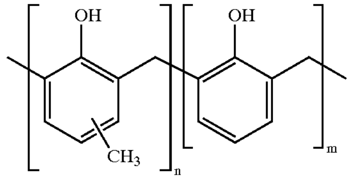

when n = m.

Other polymers suitable for application in this invention include poly-4-hydroxystyrene; copolymers of 4-hydroxystyrene, for example with 3-methyl-4-hydroxystyrene or 4-methoxystyrene; copolymers of (meth) acrylic acid, for example with styrene; copolymers of maleiimide, for example with styrene; hydroxy or carboxy functionalised celluloses; dialkylmaleiimide esters; copolymers of maleic anhydride, for example with styrene; and partially hydrolysed polymers of maleic anhydride.

Preferably the composition contains at least 20%, more preferably at least 50%, most preferably at least 70% of a phenolic resin, by weight on total weight of the composition.

Said heat sensitive composition preferably includes a modifying means for modifying the properties of the polymeric substance. Such a modifying means is preferably arranged to alter the developer solubility of the polymeric substance compared to when said modifying means is not present in a said heat sensitive composition. Said modifying means may be covalently bonded to said polymeric substance or may be a compound which is not covalently bonded to said polymeric substance.

Said modifying means may be selected from:

functional groups Q, as described in any statement hereinafter with regard to what is referred to as the "'169 invention", described hereinafter;

diazide moieties as described in any statement hereinafter with regard to what is referred to as the "'172 invention", described hereinafter;

nitrogen containing compounds wherein at least one nitrogen atom is either quaternized, incorporated in a heterocyclic ring or quaternized and incorporated in a heterocyclic ring, as described in any statement hereinafter with regard to what is referred to as the "'117 invention", described hereinafter;

latent Bronsted acids, as described in any statement hereinafter with regard to what is referred to as the "046 embodiment" or the "'877 invention", described hereinafter.

Said heat sensitive composition preferably passes tests 1 to 5 described hereinafter with respect to the '169 invention wherein a reference in a test to a "corresponding unfunctionalised polymeric substance" should be substituted with a reference to said polymeric substance described above in the absence of said modifying means; and a reference to a "functionalised polymeric substance" should be substituted with a reference to said polymeric substance described above in the presence of said modifying means.

Said heat sensitive composition preferably also passes test 6 described hereinafter with reference to the '117 invention wherein a reference in test 6 to the "active polymer and the reversible insolubiliser compounds" should be substituted with a reference to the polymeric substance described above in the presence of said modifying means. Thus, preferably said composition is not UV sensitive. Additionally, preferably, it is not visible light sensitive so that handling of the composition may be facilitated.

Said developer resistance means is preferably non-radiation sensitive. More particularly, said developer resistance means is preferably not heat and/or light and/or UV sensitive.

In broad terms there are three ways in which heat can be patternwise delivered to the heat sensitive composition of the precursor, in use. These are:

the direct delivery of heat by a heated body, by conduction. For example the upper surface of the precursor may be contacted by a heat stylus; or the lower surface of a support onto which the composition has been coated may be contacted by a heat stylus.

the use of incident electromagnetic radiation to expose the composition, the electromagnetic radiation being converted to heat, either directly or by a chemical reaction undergone by a component of the composition. The electromagnetic radiation could for example be infrared, UV or visible radiation.

the use of charged-particle radiation, for example electron beam radiation. Clearly, at the fundamental level the charged-particle mode and the electromagnetic mode are convergent; but the distinction is clear at the practical level.

In order to increase the sensitivity of the precursor to imaging radiation, said precursor may include a layer which includes a radiation absorbing compound capable of absorbing incident electromagnetic radiation and converting it to heat (hereinafter called a "radiation absorbing compound").

Said radiation absorbing compound is preferably a black body radiation absorber.

The radiation absorbing compound is usefully carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

Preferably, the precursor for providing a resist pattern is arranged to be imagewise exposed directly by a laser which suitably emits radiation at above 450 nm, preferably above 500 nm, more preferably above 600 nm and especially above 700 nm. Most preferably it emits radiation at above 800 nm. Suitably it emits radiation below 1400 nm, preferably below 1200 nm.

Preferably, the radiation absorbing compound (which compound is preferably an infra-red radiation absorber) is one whose absorption spectrum is significant at the wavelength output of the radiation source, for example laser. Usefully it may be an organic pigment or dye such as phthalocyanine pigment. Or it may be a dye or pigment of the squarylium, merocyanine, cyanine, indolizine, pyrylium or metal dithioline classes.

Examples of such compounds are:

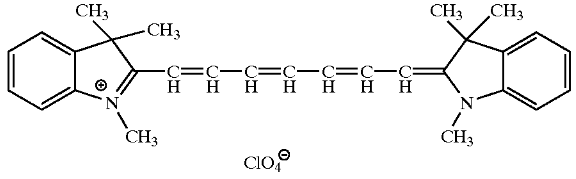

and

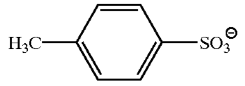

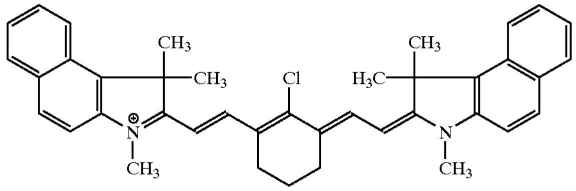

and KF654 B PINA as supplied by Riedel de Haen UK, Middlesex, England, believed to have the structure:

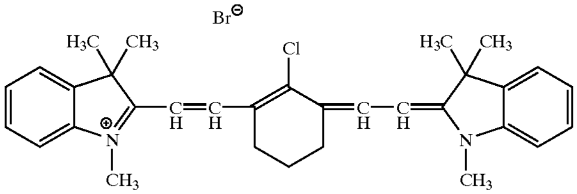

In a radiation sensitive composition intended to require UV radiation for patternwise exposure the composition may contain any radiation absorbing compound able to convert incident UV radiation to heat. Suitable radiation absorbing compounds include black body radiation absorbers, for example carbon black or graphite, and latent Bronsted acids, including onium salts and haloalkyl-substituted S-triazines, as described in U.S. Pat. Nos. 5,491,046 and 4,708,925. The relevant lists of UV absorbing compounds in these patents are incorporated herein by reference. Diazide derivatives may also be employed.

In radiation sensitive compositions intended to require visible radiation for imagewise exposure, the compositions may suitably contain a black body absorber, for example carbon black or graphite, or a triazine compound "tuned" to absorb visible light.

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they have no or insignificant effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Many dyes have a marked effect on the solubility of the unheated composition in the developer, typically making it much less soluble, and use of such dyes is not within the ambit of the present invention.

Suitably the radiation absorbing compound, when present in the heat sensitive composition, constitutes at least 0.25%, preferably at least 0.5%, more preferably at least 1%, most preferably at least 2%, preferably up to 25%, more preferably up to 20%, especially up to 15 wt % of the total weight of the radiation sensitive composition. A preferred weight range for the radiation absorbing compound may be expressed as 2–15% of the total weight of the composition. More specifically, in the case of dyes the range may preferably be 0.25–15% of the total weight of the composition, preferably 0.5–8%, whilst in the case of pigments the range may preferably be 1–25%, preferably 2–15%. For pigments, 5–15% may be especially suitable. In each case the figures given are as a percentage of the total weight of the dried composition. There may be more than one radiation absorbing compound. References herein to the proportion of such compound(s) are to their total content.

In one embodiment of the invention, said precursor may include an additional layer comprising a said radiation absorbing compound. This multiple layer construction can provide routes to high sensitivity as larger quantities of absorber can be used without affecting the function of the image forming layer. In principle any radiation absorbing material which absorbs sufficiently strongly in the desired band can be incorporated or fabricated in a uniform coating. Dyes, metals and pigments (including metal oxides) may be used in the form of vapour deposited layers. Techniques for the formation and use of such films are well known in the art, for example as described in EP 0,652,483.

An aqueous developer composition for developing a said precursor is dependent on the nature of the heat sensitive composition. Common components of aqueous lithographic developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably, the aqueous developer is an alkaline developer containing inorganic or organic metasilicates especially when the heat sensitive composition comprises a phenolic resin.

We will now describe separately, in detail, several heat sensitive compositions to which we have shown the present invention may be applied.

Unless otherwise stated, words, letters and numerals used to describe components of one heat sensitive composition described hereinafter are independent of the words, letters and numerals used to describe each other heat sensitive composition described hereinafter, even if some of the same words, letters and/or numerals are used with reference to different heat sensitive compositions.

The present invention may be applied in relation to heat sensitive compositions as described in our non-published patent application No. 9714169.1 (taken forward as PCT/GB98/01953, MY PI 9803095 and ZA 98/5913) which we herein call the '169 invention. The pages which follow are incorporated from these specifications.

Said heat sensitive composition may comprise a polymeric substance having functional groups Q thereon, such that the functionalised polymeric substance has the property that it is developer insoluble prior to delivery of radiation and developer soluble thereafter, wherein the functional groups Q do not comprise a naphthoquinone diazide (NQD) or a benzoquinone diazide (BQD) group.

Said heat sensitive composition may comprise a polymeric substance having functional groups Q thereon, such that the functionalised polymeric substance has the property that it is developer insoluble prior to delivery of radiation and developer soluble thereafter, wherein the functional groups Q do not contain a diazide group.

Said heat sensitive composition may comprise a polymeric substance having functional groups Q thereon, such that the functionalised polymeric substance has the property that it is developer insoluble prior to delivery of radiation and developer soluble thereafter, wherein the functional groups are not chemically decomposed on exposure to said radiation. By "not chemically decomposed" we mean that covalent bonds are not broken by exposure to radiation to any extent which is significant in the effectiveness of the precursor.

Said heat sensitive composition may comprise a polymeric substance having functional groups Q thereon, such that the functionalised polymeric substance has the property that it is developer insoluble prior to delivery of radiation and developer soluble thereafter, wherein the functional groups Q do not comprise acid groups or acid generating groups, in each case protected by labile protective groups removed on exposure to said radiation.

Said heat sensitive composition may comprise a polymeric substance having functional groups Q thereon, such that the functionalised polymeric substance has the property that it is developer insoluble prior to delivery of radiation and developer soluble thereafter, wherein the functional groups Q are not additionally primarily responsible for the absorption of said radiation.

It is believed that the difference in the developer solubility between the functionalised polymeric substance compared with the corresponding unfunctionalised polymeric substance may involve several mechanisms but that acid generation on exposure to said radiation is not significant. It is further believed that one important mechanism is a hydrogen bonding interaction between the functional groups Q and other groups of the polymeric substance. Intramolecular hydrogen bonding is likely to be more important but intermolecular hydrogen bonding may also be important, and may even be more important in some systems. Suitably, therefore, the functionalised polymeric substance is such that there is hydrogen bonding between the said functional groups Q and other groups of the polymeric substance, in addition to covalent bonding of the functional groups Q, to the polymeric substance.

Said heat sensitive composition may comprise a polymeric substance having functional groups Q thereon, such that the functionalised polymeric substance has the property that it is developer insoluble prior to delivery of radiation and developer soluble thereafter, wherein there is hydrogen bonding between said functional groups Q and other groups of the same molecule or other molecule(s) of the polymeric substance.

In the practice of the '169 invention, it is preferred that composition components are selected, which do not produce a gas upon exposure to radiation.

Preferably the corresponding unfunctionalised polymeric substance is significantly more soluble in a selected developer, than the corresponding polymeric substance functionalised by the groups Q. Preferably, in practical terms it may be regarded as a soluble polymeric substance.

It is believed that heat breaks down the hydrogen bonding with no primary structure decomposition i.e. no covalent bond breaking is believed to be required for the effectiveness of the method.

Although the '169 invention is not limited in respect of the manner in which the groups Q are bonded to the polymeric substance, preferably a said corresponding unfunctionalised polymeric substance has hydroxy groups, which are functionalised by the groups Q. Preferably the said functionalised polymeric substance retains hydroxy groups. That is, the functional groups Q may covalently bond to the polymeric substance through reaction with hydroxy groups thereof, but preferably not all of the hydroxy groups are thereby reacted.

Preferably the ratio of functional groups Q in the functionalised polymeric substance to hydroxy groups in the corresponding unfunctionalised polymeric substance is in the range 1:100 to 1:2. More preferably the said functional group ratio is in the range 1:50 to 1:3. Most preferably the said functional group ratio is in the range 1:20 to 1:6.

Examples of suitable polymeric substances may be selected from phenolic resins, styrenes, for example 4-hydroxystyrene, 3-methyl-4-hydroxystyrene and 4-methoxystyrene, acrylic acids, for example, methacrylic acid and acrylic acid, maleiimide, maleic acid and maleic acid anhydride, in each case, as homopolymers, co-polymers or terpolymers.

Preferably the polymeric substance of the '169 invention is not a poly(vinyl phenol) polymer.

Instead of hydroxy groups the unfunctionalised polymeric substance may comprise thiol groups which can likewise be functionalised. However hydroxyl groups are preferred for functionalisation.

Most preferably the said unfunctionalised polymeric substance is a phenolic resin. Particularly useful phenolic resins in the '169 invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolak resins, resole resins and novolak/resole resin mixtures. Examples of suitable novolak resins have been generally described above.

The functional groups Q suitably enable hydrogen bonding with moieties of the functionalised polymer. Suitable moieties Q known to favour hydrogen bonding and which may be comprised by the functional groups Q, may include amino, monoalkylamino, dialkylamino, amido, monoalkylamido, dialkylamido, chloro, fluoro, carbonyl, sulphinyl and sulphonyl moieties.

Preferably the functional groups Q are bonded to the polymeric substance by an esterification reaction to form a resin ester.

A preferred composition of the '169 invention may be defined by the formula $R(Q)_n$ where R is the polymer chain of the polymeric substance and $(Q)_n$ represents functional groups bonded thereto, and Q represents a moiety which can hydrogen bond to the polymer chain R of the same molecule or an adjacent molecule or molecules. n represents a plural integer.

Preferably Q represents a group of formula —T—Z where T represents a moiety which can hydrogen bond to the polymer chain R of the same molecule or an adjacent molecule or molecules and Z represents a further moiety which may or may not hydrogen bond to the polymer chain R. In such cases the polymer chain R requires other substituents which can participate in the hydrogen bonding, for example thiol or, most preferably, hydroxy groups.

Suitably Q represents a group of formula —O—$T^1$—Z where $T^1$ is a moiety which can hydrogen bond to the polymer chain R of the same molecule or an adjacent molecule or molecules. Suitably $T^1$ represents a carbonyl group, a sulphinyl group or a sulphonyl group. Preferably it represents a carbonyl or, especially, a sulphonyl group.

One group Q may be covalently bonded to the polymeric resin at more than one site thereof, to form a cyclic structure. For example Q may be defined as being a group of formula —O—X(Z)—O— where X represents a linking moiety and Z represents a said further moiety. This may occur, for example, in certain phosphorus-modified novolak resins, produced by reaction with phosphoric acids or phosphorus oxyhalides.

Preferably a said linking moiety X can hydrogen bond to the polymer chain R of the same molecule or an adjacent molecule or molecules.

In such embodiments, a said linking moiety X may suitably be a group of formula —P(O)—.

A moiety Z may for example be an optionally substituted alkyl, alkenyl, alkynyl, cycloalkyl, aryl, heteroaryl, non-aromatic heterocyclic, aralkyl or heteroaralkyl group.

Unless otherwise indicated in relation to the '169 invention, the following definitions apply to the definition of the moiety Z.

- an alkyl, alkenyl or alkynyl group may be linear or branched and may contain up to 10, preferably up to 8, carbon atoms, suitable examples being methyl, ethyl, propyl, butyl, pentyl, hexyl, heptyl, octyl, vinyl, allyl and propargyl. Unbranched groups may be preferred but branched groups may be employed.
- a cycloalkyl group may contain from 3 to 12, preferably 3 to 8, carbon atoms, and is suitably cyclopropyl or cyclohexyl, but could be a fused/bridged structure such as 10-camphoryl.
- the alkylene portion of an aralkyl or heteroaralkyl group is suitably a $C_{1-4}$ alkylene group, especially methylene (—$CH_2$—).
- aryl groups are preferably naphthyl or phenyl.
- aralkyl groups are preferably ($C_{1-4}$ alkyl)phenyl or ($C_{1-4}$ alkyl) naphthyl, especially benzyl or naphthylmethyl.
- heteroaromatic or heterocyclic groups suitably are respectively aromatic or non-aromatic groups, containing within the carbon atom ring or rings 1 to 4 hetero atoms independently selected from oxygen, sulphur and nitrogen. Fused heteroaromatic or heterocyclic groups may be employed but preferably the group is a single ring having 5 or 6 atoms in the ring. Preferred is pyrazolyl and, especially, thienyl.
- in relation to optional substituents of the aliphatic moieties set out above, namely alkyl, cycloalkyl, alkenyl, alkynyl and heterocyclic (non-aromatic) groups and of the alkylene portions of the aralkyl and heteroaralkyl groups, specific examples of such substituents include halo, nitro, cyano, carbonyl, hydroxy, thiol, amino, mono-$C_{1-4}$ alkylamino, di-$C_{1-4}$ alkylamino, amido (—$CONH_2$), mono-($C_{1-4}$ alkyl)amido (—$CONHR^1$), di-($C_{1-4}$alkyl)amido(—$CONR^1R^2$), $C_{1-4}$ alkoxy, $C_{1-4}$ haloalkoxy, ($C_{1-4}$alkyl)carbonylamino ($R^3C(O)NH$—, for example acetamido), —COOH, ($C_{1-4}$ alkyl) carbonyl and ($C_{1-4}$ alkoxy)carbonyl groups. Good results have however, been obtained using aliphatic moieties which are unsubstituted.
- in relation to optional substituents of an aryl or heteroaryl moiety set out above, including of an aralkyl or heteroaralkyl group, optional substituents include halo, nitro, cyano, hydroxy, thiol, amino mono-$C_{1-4}$ alkylamino, di-$C_{1-4}$ alkylamino, amido (—$CONH_2$), mono-($C_{1-4}$ alkyl)amido (—$CONHR^1$), di-($C_{1-4}$ alkyl) amido ($CONR^1R^2$), $C_{2-4}$ alkenyl, $C_{1-4}$ alkyl, $C_{1-4}$ alkoxy, ($C_{1-4}$ alkyl)carbonylamino ($R^3C(O)NH$—, for example acetamido), —COOH, ($C_{1-4}$ alkyl)carbonyl and ($C_{1-4}$ alkoxy) carbonyl. When there is substitution of said aryl or heteroaryl groups 1 to 3 substituents may suitably be employed. Alkyl, alkylamino, alkylamido, alkylcarbonylamino, alkenyl, alkoxy, alkylcarbonyl and alkoxycarbonyl moieties carried by said aryl or heteroaryl groups are preferably unsubstituted but may be substituted by substituents selected from the list given above for aliphatic moieties.
- a halo moiety is preferably a fluoro, chloro or bromo group.

Preferably the moiety Z is an optionally substituted aryl, heteroaryl or alkyl group. An especially preferred aryl group is a phenyl or naphthyl group optionally substituted by 1–3 moieties independently selected from hydroxy, halo, $C_{1-4}$ alkyl (especially methyl), $C_{1-4}$ haloalkyl (especially $CF_3$), $C_{1-4}$ alkoxy (especially methoxy), amino, mono-($C_{1-4}$ alkyl) amino (especially methylamino), and di-($C_{1-4}$ alkyl)amino (especially dimethylamino). An especially preferred aryl group is a naphthyl group, a dansyl group, a phenyl group or a 4-methylphenyl group. An especially preferred optionally substituted alkyl group is a $C_{2-8}$ alkyl group, especially an n-$C_{3-6}$ alkyl group.

An especially preferred composition of the '169 invention comprises a phenolic resin, to hydroxy groups of which moieties selected from —O—$SO_2$-tolyl, —O-dansyl-, —O—$SO_2$-thienyl, or —O—$SO_2$-naphthyl and —O—CO—Ph are bonded.

It should be noted that the '169 invention is characterised in certain aspects by the presence, in the composition, of functional groups Q which do not contain an NQD or BQD group. However the presence of diazide groups additional to the functional groups Q is not excluded from the above definitions of the '169 invention.

Also, the presence, in the composition, of simple diazide compounds, for example NQD or BQD compounds, is not excluded from the above definitions of the '169 invention.

Thus, one composition useful in the method of the '169 invention comprises a phenolic resin having groups Q (preferably hydroxy groups to which moieties selected from —O—$SO_2$-tolyl, —O-dansyl, —O—$SO_2$-thienyl, —O—$SO_2$-naphthyl and —O—CO—Ph are bonded) in admixture with simple diazide-containing compounds.

Another composition useful in the method of the '169 invention comprises a phenolic resin, to hydroxy groups of which sulphonyl diazide moieties are bonded, and to further hydroxy groups of which moieties Q, preferably selected from —O—$SO_2$-tolyl, —O-dansyl, —O—$SO_2$-thienyl, —O—$SO_2$-naphthyl and —O—CO—Ph, are bonded.

Compositions containing resins carrying groups Q and also containing diazide groups may be novel and constitute a further aspect of the '169 invention. Furthermore resins bearing diazide groups and groups Q as separate functional groups, examples being described in the previous paragraph, are novel and constitute a further aspect of the '169 invention, along with methods for their preparation, suitably by co-esterification.

When diazide groups are used in the '169 invention they preferably comprise diazo groups $=N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-napthoquinonediazide (NQD) moieties.

A BQD moiety may, for example, comprise the 1,4- or, preferably, the 1,2-benzoquinonediazide moiety.

An NQD moiety may, for example, comprise the 1,4-, 2,1- or, most preferably, the 1,2-naphthoquinone diazide Generally, NQD moieties are preferred to BQD moieties when used in the practice of the '169 invention.

The most preferred diazide moiety when used in the practice of the '169 invention is the 1,2-naphthoquinonediazide moiety.

In addition to the polymeric substance, or substances, as defined above, the composition may contain an additional polymeric substance, or substances. Such may be regarded as "inactive", in having a given level of inherent developer solubility and not being functionalised to alter that inherent developer solubility, or may be regarded as an additional "active" polymeric substance, or substances, including for example an NQD resin ester. In such a composition having a blend of polymeric substances it should be noted that the polymeric substance(s) of the '169 invention can be present in a lower amount, by weight, than the other polymeric substance(s). Suitably the polymeric substance of the '169 invention may be present in an amount of at least 10%, preferably at least 20% by total weight of the polymeric substances present in the composition.

It should be noted that the quantitative definitions presented above are typical ranges, and that the precise selection will depend on the particular circumstances. For example the selection of highly effective functional groups Q may mean that a blend of polymeric substances may be used, with the polymeric substance(s) of the '169 invention in relatively low proportion; and/or that the aforesaid functional group ratio may be lower than if a less effective functional group had been selected. The pattern-forming conditions selected and the developer to be used, will also be of relevance. The selection of a higher functional group ratio may mean that a lesser amount of polymeric substance(s) of the invention in a blend thereof may be employed; an inherently more soluble unfunctionalised polymeric substance may mean that a weaker developer can be used (to environmental advantage), or a lesser delivery of radiation, or a lower functional group ratio, or a faster processing speed either in terms of radiation delivery or development time, or both. There are thus several composition, imaging and developing variables which can be employed to advantage for a given application.

Where a radiation absorbing compound generally described above is included in a heat sensitive composition according to the '169 invention it should be noted that the function of such compounds when present in the composition will not be primarily to bring about the radiation-induced solubility change; it is primarily the functional groups Q of the polymeric substance which do that. Rather, it will be primarily to absorb radiation, to produce the heat believed to be necessary for the effectiveness of the composition. That is, in the absence of the functional groups Q the UV absorbing compounds would absorb UV and release heat but this would not of itself be sufficient to bring about a solubility change, or at least a solubility change of any useful level. This is a matter of selecting suitable UV absorbing compounds and including them in suitable amounts. If necessary simple tests may be devised to check the function of the UV absorbing compounds.

Whilst the presence of a UV absorbing compound may sometimes unavoidably make some contribution to the control of developer solubility it is desirable that this should be minimised—its presence in compositions of the '169 invention is primarily to deliver heat on exposure to UV radiation and the best control of the functioning of the composition is achieved by separating the chemistries of the radiation absorption and the developer solubility change.

When present in compositions of the '169 invention a UV absorbing compound, including a diazide derivative, is preferably present as a simple compound, not covalently bonded to the active polymer; whereas the functional groups Q are covalently bonded to the active polymeric substance.

The compositions used in the '169 invention may contain other ingredients such as stabilising additives, inert colorants, and additional inert polymeric binders as are present in many positive working compositions.

The major proportion of the heat sensitive composition is preferably constituted by polymeric substance(s), including the "active" polymeric substance(s) and, when present, "inactive" polymeric substance(s). Preferably a minor proportion of the composition is constituted by additional components (i.e. components in addition to said developer resistance means), when present at all.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

Preferred functionalised polymeric substances are resin esters of the general formula $R(Q)_n$ where R is the polymer chain of the polymeric substance, and Q represents a group of formula —O—$T^1$—Z where $T^1$ represents a carbonyl group, a sulphinyl group or a sulphonyl group, or a group of the formula —O—X(Z)—O— where X represents a group —P(O)—; wherein Z represents an alkyl, alkenyl, alkynyl, cycloalkyl, aryl, heteroaryl, non-aromatic heterocyclic, aralkyl or heteroaralkyl group, each such group being optionally substituted; wherein optional substituents of the aryl and heteroaryl groups, and of the aryl and heteroaryl parts of the aralkyl or heteroaralkyl groups, are selected from halo, nitro, cyano, hydroxy, thiol, amino, optionally substituted mono-$C_{1-4}$ alkylamino, optionally substituted di-$C_{1-4}$ alkylamino, amido, optionally substituted mono-($C_{1-4}$ alkyl)amido, optionally substituted. di-($C_{1-4}$ alkyl) amido, optionally substituted $C_{2-4}$ alkenyl, optionally substituted $C_{1-4}$ alkyl, optionally substituted $C_{1-4}$ alkoxy, ($C_{1-4}$ alkyl)carbonylamino, —COOH, optionally substituted ($C_{1-4}$ alkyl)carbonyl and optionally substituted ($C_{1-4}$ alkoxy) carbonyl groups; and wherein optional substituents of the alkyl, alkenyl, alkynyl, cycloalkyl and non-aromatic heterocyclic groups, and of the alkyl parts of the aralkyl and heteroaralkyl groups, and of the alkyl, alkoxy, alkylamino, alkylamido, alkylcarbonyl, alkoxycarbonyl, alkylcarbonylamino and alkenyl moieties optionally substituting said aryl or heteroaryl moieties are selected from halo, nitro, cyano, carbonyl, hydroxy, thiol, amino, mono-$C_{1-4}$ alkylamino, di-$C_{1-4}$ alkylamino, amido, mono-($C_{1-4}$ alkyl)amido, di-($C_{1-4}$alkyl)amido, $C_{1-4}$ alkoxy, —COOH, ($C_{1-4}$ alkyl) carbonylamino, ($C_{1-4}$ alkyl)carbonyl and ($C_{1-4}$ alkoxyl) carbonyl groups.

Simple tests, tests 1 to 5 below, may be carried out to determine if a composition comprising a said polymeric, substance, a developer (suitably selected from those described above) and hydrophilic support (suitably selected from those described below), are together likely to be suitable for use in the '169 invention, in the context of lithographic printing. For simplicity these tests involve the direct delivery of heat, whereas the delivery of heat to the composition in use may be direct or via conversion of incident electromagnetic or charged-particle beam radiation, as described above.

The tests below are suitably carried out in the absence of said developer resistance means.

Test 1

The composition comprising the said corresponding unfunctionalised polymeric substance is coated on a hydrophilic support and dried. Then the surface is inked-up. If a uniform inked coating is obtained then the composition is ink-accepting when laid down as a coating.

Test 2 (optional)

The support coated with the composition comprising the said corresponding unfunctionalised polymeric substance is processed in the selected developer for a suitable time which may be determined by trial and error but will typically be between 15 to 120 seconds, at room temperature, and then rinsed, dried and inked-up. If no ink surface is obtained then the composition has dissolved in the developer.

Test 3

The composition comprising the functionalised polymeric substance is coated on the support, dried and inked-up. If a uniform inked coating is obtained then the composition is ink-accepting when laid down as a coating.

Test 4

The support coated with the composition comprising the functionalised polymeric substance is processed in a the selected developer for a suitable time which may be determined by trial and error but will typically be between 15 to 120 seconds, at room temperature, and then rinsed, dried and inked-up. If a uniform inked coating is obtained then the composition is insoluble in the developer.

Test 5

The support coated with the composition comprising the functionalised polymeric substance is heated, for example in an oven or by contact with a heated body, such that the composition reaches a suitable temperature for an appropriate period of time. Then it is processed in the selected developer for an appropriate period of time at room temperature. The surface is then dried and inked-up. If no ink surface is obtained then the heated composition has dissolved in the developer. The temperature and time for the heating stage depend on the components selected for the composition and on their proportion. Simple trial and error experiments may be undertaken to determine suitable conditions. Initial failures may therefore not be determinative but if there is a persistent inability to obtain a pass result despite reasonable efforts, the conclusion must be that the composition has failed this test. Preferably a typical composition, for example a functionalised phenolic resin, may be heated such that the composition reaches a temperature of 50° C. to 180° C. for 5 to 30 seconds. Then it is processed in the selected developer for a suitable period of time which may be determined by trial and error but will typically be 15 to 120 seconds, at room temperature. Most preferably, the functionalised polymeric substance is heated such that the composition reaches a temperature of 100° C. to 160° C. for 5 to 20 seconds. Then it is processed in the selected developer typically for 15 to 120 seconds at room temperature.

If the composition can pass these tests then it is suitable for use on a lithographic printing plate in the method of the '169 invention. Equally, a composition passing the test is likely to fulfil the requirements for a photoresist for electronic circuits. However, the aspects of the above tests which determine ink accepting properties are irrelevant in this context and can be dispensed with.

That concludes the general description of the '169 invention.

The present invention may be applied in relation to heat sensitive compositions as described in our non-published application 9714172.5 which we herein call the '172 invention, now taken forward as PCT/GB98/01957, MY PI 9803069 and ZA 98/5912. The pages which follow are incorporated from these specifications.

Said heat sensitive composition may comprise a polymeric substance and diazide moieties, wherein the said composition has the property that it is developer insoluble prior to delivery of said radiation and developer soluble thereafter, wherein said radiation is entirely or predominantly direct heat radiation or electromagnetic radiation of wavelength exceeding 500 nm.

Preferably the polymeric substance in the absence of said diazide moieties is significantly more soluble in a selected developer, than the corresponding polymeric substance in the presence of said diazide moieties. Preferably, in practical terms it may be regarded as a soluble polymeric substance.

Examples of suitable polymeric substances may be selected from phenolic resins, styrenes, for example 4-hydroxystyrene, 3-methyl-4-hydroxystyrene and 4-methoxystyrene, acrylic acids including methacrylic acid and acrylic acid, maleiimide, maleiic acid and maleiic acid anhydride, in each case, as homopolymers, co-polymers or terpolymers.

Most preferably the said polymeric substance is a phenolic resin. Particularly useful phenolic resins in the '172 invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolak resins, resole resins and novolak/resole resin mixtures. Examples of suitable novolak resins have been generally described above.

Diazide moieties used in the '172 invention preferably comprise diazo groups $=N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-napthoquinonediazide (NQD) moieties.

A BQD moiety may, for example, comprise the 1,4- or, preferably 1,2-benzoquinonediazide moiety.

An NQD moiety may, for example, comprise the 1,4-, 2,1- or, most preferably, the 1,2-naphthoquinone diazide moiety.

Generally, NQD moieties are preferred to BQD moieties in the practice of the invention.

Most preferred in the practice of the '172 invention is the 1,2-naphthoquinonediazide moiety.

Suitably the composition comprises a BQD or NQD ester of a phenolic polymeric substance or a BQD or NQD compound, for example ester, and a phenolic polymeric substance in admixture. The preferred esters are sulphonate esters.

Examples of preferred naphthoquinone diazide moieties which may be used in the photosensitive composition are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,036,123; 3,061,430; 3,102,809; 3,105,465; 3,635,709; and 3,647,443. Among these, preferred are o-naphthoquinonediazido sulphonates or o-naphthoquinonediazido carboxylates of aromatic hydroxyl compounds; o-naphthoquinone diazido sulphonic acid amides or o-naphthoquinonediazido carboxylic acid amides of aromatic amine compounds, for instance, esters of naphthoquinone-1,2-diazido sulphonic acid with polyhydroxyphenyl; esters of naphthoquinone-1,2-diazido-4-sulphonic acid or naphthoquinone-1,2-diazido-5-sulphonic acid with pyrogallol/acetone resins; esters of naphthoquinone-1,2-diazidosulphonic acid with novolak-type phenol/formaldehyde resins or novolak-type cresol/formaldehyde resins; amides of poly(p-aminostyrene) and naphthoquinone-1,2-diazido-4-sulphonic acid or naphthoquinone-1,2-diazido-5-sulphonic acid; esters of poly (p-hydroxystyrene) and naphthoquinone-1,2-diazido-4-sulphonic acid or naphthoquinone-1,2-diazido-5-sulphonic acid; and amides of polymeric amines with naphthoquinone-1,2-diazido-4-sulphonic acid. The term "ester" used herein also includes partial esters.

The '172 invention requires the use of a composition comprising a polymeric substance and diazide moieties. The diazide moieties may be present as simple compounds admixed with the polymeric substance or, as is preferred, as moieties covalently bonded to the polymeric substance. It should be noted that moieties Q, not comprising diazide moieties, may additionally be covalently bonded to the polymeric substance; or may advantageously be functional groups of an additional polymeric substance, within the composition.

Apart from the fact that they do not comprise diazide moieties, such moieties Q may be further characterised by one or more of the following features:

- they are preferably not chemically decomposed on exposure to said radiation. By "not chemically decomposed" we mean that covalent bonds are not broken by exposure to said radiation to any extent which is significant in the effectiveness of the method. Further, they preferably do not produce a gas on exposure to radiation.
- they preferably do not comprise acid groups or acid generating groups protected by labile protective groups removed on exposure to said radiation.
- preferably they assist the solubility changes referred to above and are not additionally primarily responsible for the absorbtion of said radiation.
- there is preferably hydrogen bonding between said functional groups Q and other groups of the same molecule or other molecule(s) of the polymeric substance. It is believed that heat breaks down the hydrogen bonding with no primary structure decomposition i.e. no covalent bond breaking is believed to be required for the effectiveness of the method.

Although the manner in which such further groups Q are bonded to the polymeric substance may not be significant, preferably a corresponding unfunctionalised polymeric substance has hydroxy groups, which are functionalised by the groups Q. Preferably the polymeric substance having functional groups Q thereon has hydroxy groups. The functional groups Q may covalently bond to the polymeric substance through reaction with hydroxy groups thereof, but preferably not all of the hydroxy groups are thereby reacted.

The functional groups Q, when present in the composition, thus suitably enable hydrogen bonding with moieties of the functionalised polymer, whether of the same molecule or an adjacent molecule, or molecules. Suitable functional groups Q known to favour hydrogen bonding include amino, monoalkylamino, dialkylamino, amido, monoalkylamido, dialkylamido, chloro, fluoro, carbonyl, sulphinyl and sulphonyl groups.

Preferably the functional groups Q, when present, are bonded to the polymeric substance by an esterification reaction to form a resin ester.

Preferably Q represents a group of formula —T—Z where T represents a moiety which can hydrogen bond to the polymer chain R of the same molecule or an adjacent molecule or molecules and Z represents a further non-diazide moiety which may or may not hydrogen bond to the polymer chain R of the same molecule or an adjacent molecule or molecules. In such cases the polymer chain R requires other substituents which can participate in the hydrogen bonding, for example thiol or, most preferably, hydroxy groups.

Suitably Q represents a group of formula —O—$T^1$—Z where $T^1$ and Z are as described above in relation to the '169 invention.

One composition of the '172 invention comprises an unfunctionalised phenolic resin, in admixture with simple diazide-containing compounds.

Another composition of the '172 invention comprises a phenolic resin, to hydroxy groups of which moieties selected from —O—$SO_2$-tolyl, —O-dansyl, —O—$SO_2$-thienyl, —O—$SO_2$-naphthyl and —O—CO—Ph are bonded, in admixture with simple diazide-containing compounds.

Another composition of the '172 invention comprises a phenolic resin, to hydroxy groups of which sulphonyl diazide moieties are bonded, and to further hydroxy groups of which moieties selected from —O—$SO_2$-tolyl, —O-dansyl, —O—$SO_2$-thienyl, —O—$SO_2$-naphthyl and —O—CO—Ph are bonded.

Although the precursor has been described as working in a positive mode it has also been determined that by means of a further step a negative working mode is possible. This requires an overall exposure to UV radiation subsequent to heat mode imaging and prior to development. It is then found that the areas of the coating not heated dissolve. This constitutes a further aspect of the '172 invention.

Tests 1 to 5 described above with reference to the '169 invention may be carried out to determine if a composition is suitable for use according to the '172 invention. The references to "said corresponding unfunctionalized polymeric substance" and the "functionalized polymeric substance" in the tests described above should be substituted with references to "said polymeric substance without the diazide moieties being present" and the "polymeric substance and the diazide moieties" respectively, when the tests are applied to the '172 invention.

If the composition can pass these tests then it is suitable for use on a lithographic printing plate in the positive working method of the present invention provided of course that in embodiments involving the conversion of non-UV electromagnetic radiation to heat, the appropriate radiation therefor is delivered, having regard to any radiation absorbing compound which is present. Equally, a composition passing these tests is likely to fulfil the requirements for the negative working mode involving subsequent overall exposure to UV radiation provided again that the appropriate UV radiation therefor is delivered. Equally, a composition passing these tests is likely to fulfil the requirements for a photoresist for electronic circuits whether in positive or negative modes. However, the aspects of the above tests which determine ink-accepting properties are irrelevant in this context and can be dispensed with.

That concludes the general description of the '169 invention.

The present invention may be applied in relation to heat sensitive compositions as described in our non-published patent application PCT/GB97/01117 which we herein call the '117 invention. This patent application was unpublished at the priority date of the present invention and has since been published under the publication number WO97/39894. The pages which follow are incorporated from the PCT application.

Said heat-sensitive composition may comprise an aqueous developer-soluble polymeric substance (hereinafter called the "active polymer") and a compound which reduces the aqueous developer solubility of the polymeric substance (hereinafter called the "reversible insolubiliser compound") wherein the aqueous developer solubility of the composition is increased on heating and that the aqueous developer solubility of the composition is not increased by incident UV radiation.

In relation to the '117 invention, when we state that the aqueous developer solubility of the composition is increased on heating we mean that it is substantially increased, for example, by an amount useful in a lithographic printing process. When we state that the aqueous developer solubility of the composition is not increased by incident UV radiation we mean that it is not substantially increased, that is by an amount which would mean that UV safe lighting conditions would have to be employed. Thus, insubstantial increases in solubility on UV radiation may be tolerated.

Whilst the applicants do not wish to be limited by any theoretical explanation of how the heat-sensitive composition of the '117 invention operates, it is believed that a thermally frangible complex is formed between the active polymer and the reversible insolubiliser compound. This complex is believed to be reversibly formed and can be broken by application of heat to the complex to restore aqueous developer solubility to the composition. It is thought that polymeric substances suitable for use in the '117 invention comprise electron rich functional groups when uncomplexed and that suitable compounds which reduce the aqueous developer solubility of the polymeric substance are electron poor. It is not thought that decomposition of components within the composition is required, or that any substantial decomposition has occurred in any examples tested to date.

Examples of functional groups of said active polymers suitable for use in the '117 invention include hydroxy, carboxylic acid, amino, amide and maleiimide functional groups. A wide range of polymeric materials are suitable for use in the '117 invention, examples of which include phenolic resins; copolymers of 4-hydroxystyrene, for example with 3-methyl-4-hydroxystyrene or 4-methyoxystyrene; copolymers of (meth)acrylic acid, for example with styrene; copolymers of maleiimide, for example with styrene; hydroxy or carboxy functionalised celluloses; copolymers of maleic anhydride, for example with styrene; partially hydrolysed polymers of maleic anhydride.

Most preferably the active polymer is a phenolic resin. Particularly useful phenolic resins according to the '117 invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful are novolak resins, resole resins and novolak/resole resin mixtures. Examples of suitable novolak resins have been generally described above.

A large number of compounds which reduce the aqueous solubility of suitable polymeric substances have been located for use as reversible insolubiliser compounds.

A useful class of reversible insolubiliser compounds are nitrogen containing compounds wherein at least one nitrogen atom is either quarternized, incorporated in a heterocyclic ring or quarternized and incorporated in a heterocyclic ring.

Examples of useful quarternized nitrogen containing compounds are triaryl methane dyes such as Crystal Violet (CI basic violet 3) and Ethyl Violet and tetraalkyl ammonium compounds such as Cetrimide.

More preferably the reversible insolubiliser compound is a nitrogen-containing heterocyclic compound.

Examples of suitable nitrogen-containing heterocyclic compounds are quinoline and triazols, such as 1,2,4-triazol.

Most preferably the reversible insolubiliser compound is a quarternized heterocyclic compound.

Examples of suitable quarternized heterocyclic compounds are imidazoline compounds, such as Monazoline C, Monazoline O,Monazoline CY and Monazoline T all of which are manufactured by Mona Industries, quinolinium compounds, such 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Quinoldine Blue and 3-ethyl-2-[3-(3-ethyl-2(3H)-benzothiazolylidene)-2-methyl-1-propenyl] benzothiazolium iodide, and the compound of formula

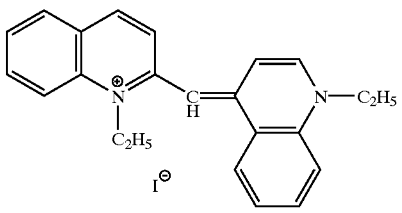

A further useful class of reversible insolubiliser compounds are carbonyl functional group containing compounds.

Examples of suitable carbonyl containing compounds are α-naphthoflavone, β-naphthoflavone, 2,3-diphenyl-1-indeneone, flavone, flavanone, xanthone, benzophenone, N-(4-bromobutyl)phthalimide and phenanthrenequinone.

The reversible insolubiliser compound may be a compound of general formula $$Q_1—S(O)_a—Q_2$$

where $Q_1$ represents an optionally substituted phenyl or alkyl group, a represents 0,1 or 2, and $Q_2$ represents a halogen atom or any alkoxy group. Preferably $Q_1$ represents a $C_{1-4}$ alkyl phenyl group, for example a tolyl group, or a $C_{1-4}$ alkyl group. Preferably a represents 1 or, especially, 2. Preferably $Q_2$ represents a chlorine atom or a $C_{1-4}$ alkoxy group, especially an ethoxy group.

Another useful reversible insolubiliser compound is acridine orange base (CI solvent orange 15).

Other useful reversible insolubiliser compounds are ferrocenium compounds, such as ferrocenium hexafluorophosphate.

In addition to the active polymer which interacts with the reversible insolubiliser compound according to the '117 invention, the heat sensitive composition may contain a polymeric substance which does not thus interact and which is not a developer resistance means as described herein. In such a composition having a blend of polymeric substances it should be noted that the active polymer can be present in a lower amount, by weight, than the additional polymeric substance(s). Suitably the active polymer is present in an amount of at least 10%, preferably at least 25% , more preferably at least 50%, by total weight of the polymer substances present in the heat sensitive composition. Most preferably, however, the active polymer is present to the exclusion of any said additional polymeric substance(s) which do not interact.

The major proportion of the composition is preferably constituted by polymeric substance(s), including the active polymer and, when present, an additional polymeric substance which does not thus interact. Preferably a minor proportion of the composition is constituted by the reversible insolubiliser compound and said developer resistance means.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

Suitably the reversible insolubiliser compound constitutes at least 1%, preferably at least 2%, preferably up to 15%, more preferably up to 25% of the total weight of the composition.

Thus a preferred weight range for the reversible insolubiliser compound may be expressed as 2–15% of the total weight of the composition.

There may be more than one active polymer which interacts with the said reversible insolubiliser compound. References herein to the proportion of such substance(s) are to their total content. Likewise there may be more than one polymeric substance which does not thus interact. References herein to the proportion of such substance(s) are to their total content. Likewise there may be more then one reversible insolubiliser compound. References herein to the proportion of such compound(s) are to their total content.

Tests 1 to 5 described above with reference to the '169 invention may be carried out to determine if a composition is suitably for use according to the '117 invention. The references to "said corresponding unfunctionalized polymeric substance" and the "functionalized polymeric substance" in the tests described with reference to the '169 invention should be substituted with references to the "active polymer in the absence of the reversible insolubiliser" and the "active polymer and the reversible insolubiliser compound" respectively, when the tests are applied to the '117 invention.

In addition a further test may be undertaken in relation to the '117 invention as described below:

Test 6. A hydrophilic support coated with the composition comprising the active polymer and the reversible insolubiliser compound is exposed to U.V. light for a suitable time which may be determined by trial and error but will typically be 30 seconds. Then it is processed in a suitable aqueous developer for a suitable time which may be determined by trial and error but will typically be 30 to 60 seconds at room temperature. The surface is then dried and inked-up. If the coating is inked-up no UV radiation induced solubilisation of the composition has occurred and thus the composition is suitably robust to normal working lighting conditions.

If the composition can pass all six tests then it is suitable for use in a composition according to the '117 invention.

Test 6 as described may be applied to each of the other heat sensitive compositions described herein in the event that it is also desirable that such compositions are, additionally, not UV sensitive.

Preferably the radiation absorbing compound in the heat sensitive composition of the '117 invention absorbs infrared radiation. However, other materials which absorb other wavelength radiation (excluding UV wavelengths), e.g. 488 nm radiation from an Ar-ion laser source, may be used with the radiation being converted to heat.

A compound (or compounds) may be included in said heat sensitive composition of the '117 invention which both reduces the aqueous developer solubility of said active polymer and is also a radiation absorbing compound. Preferred such compounds are cyanine dyes and most preferably quinolinium cyanine dyes which absorb at above 600 nm.

Examples of such compounds are:

2-[3-chloro-5-(1-ethyl-2(1H)-quinolinylidene)-1,3-pentadienyl]-1-ethylquinolinium bromide

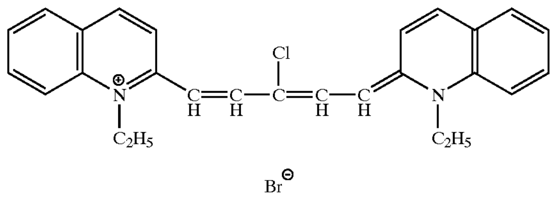

1-Ethyl-2-[5-(1-ethyl-2(1H)-quinolinylidene)-1,3-entadienyl]quinolinium iodide

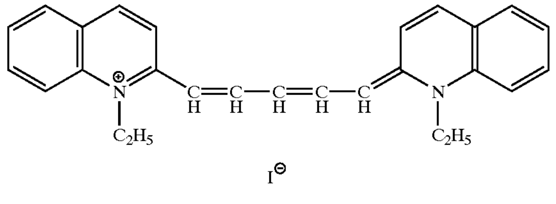

4-[3-chloro-5-(1-ethyl-4(1H)-quinolinylidene)-1,3-pentadienyl]-1-ethylquinolinium iodide

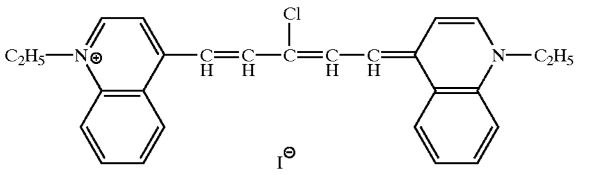

Dye D, 1-Ethyl-4-[5-(1-ethyl-4(1H)-quinolinylidene)-1,3-pentadienyl]quinolinium iodide

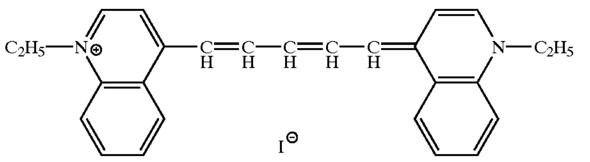

Where a said compound has the dual function of reducing solubility and absorbing radiation, said heat sensitive composition may include at least 1 wt %, preferably at least 2 wt % of such a compound. Said compound may constitute 25 wt % or less, preferably 15 wt % or less of said composition.

That concludes the general description of the ’117 invention.

The present invention may be applied in relation to heat sensitive compositions as described in U.S. Pat. No. 5,491,046 which we hereby call the ’046 embodiment.

In the ’046 embodiment, said heat-sensitive composition may comprise a resole resin, a novolak resin, a latent Bronsted acid and an infrared absorber. Said composition may be arranged to be sensitive to both ultraviolet and infrared radiation.

Said resole resin may be prepared from bis-phenol A and formaldehyde. Said novolak resin may be prepared from m-cresol and formaldehyde The term “latent Bronsted acid” refers to a precursor which forms a Bronsted acid by decomposition. The Bronsted acid is believed to catalyze a matrix-forming reaction between the resole resin and the novolak resin. Typical examples of Bronsted acids which are suitable for this purpose are trifluoromethane sulphonic acid and hexafluorophosphoric acid.

Ionic latent Bronsted acids are also suitable. Examples of these include onium salts, in particular iodonium, sulfonium, phosphonium, selenonium, diazonium and arsonium salts. Specific examples of particularly useful onium salts include: diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate.

Non-ionic latent Bronsted acids are also suitable. Examples of these include compounds of the formula:

$R^3CH_2X$ $R^3CHX_2$ $R^3CX_3$ $R^3(CH_2X)_2$ and $R^3(CH_2X)_3$ wherein X is Cl, Br, F, or $CF_2SO_3$ and $R^3$ is an aromatic group, an aliphatic group or a combination of aromatic and aliphatic groups.

Useful ionic latent Bronsted acids include those represented by the formula:

$Y^+R^4R^5R^6R^7W^-$

When Y is iodine then $R^6$ and $R^7$ are electron lone pairs and $R^4$ and $R^5$ are aryl or substituted aryl groups. When Y is S or Se then $R^7$ is an electron lone pair and $R^4$, $R^5$ and $R^6$ can be an aryl group, a substituted aryl group, an aliphatic group or a substituted aliphatic group. When Y is P or As, then $R^7$ can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pH is less than three.

Any of the onium salts described in U.S. Pat. No. 4,708,925 can be utilized as the latent Bronsted acid.

Use of diazonium salts as latent Bronsted acids is particulary preferred. They provide equivalent sensitivity to other latent Bronsted acids in the infrared region and higher sensitivity in the ultraviolet region.

An additional class of useful latent Bronsted acids are the haloalkyl-substituted s-triazines. The haloalkyl-substituted s-triazines are well known photolytic acid generators. Use of these compounds for this purpose is described, for example, in U.S. Pat. No 3,779,778.

Preferred haloalkyl-substituted s-triazines for use in this invention are compounds of the formula:

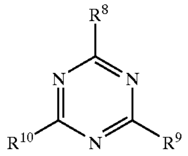

wherein $R^8$ is a substituted or unsubstituted aliphatic or aromatic radical and $R^9$ and $R^{10}$ are, independently, haloalkyl groups.

In the above formula, it is especially preferred that $R^9$ and $R^{10}$ are haloalkyl groups of 1 to 4 carbon atoms.

$R^8$ can include any substituent which does not adversely affect the photolytic acid-generating capability of the s-triazine compound. Such substituents include alkyl groups and alkoxy groups.

Particularly preferred haloalkyl-substituted s-triazines are compounds of the formula:

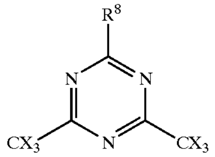

wherein $R_8$ is a substituted or unsubstituted aliphatic or aromatic radical and each X preferably is, independently, a halogen atom.

The most preferred haloalkyl-substituted s-triazines compounds for use in the second embodiment are of the formula:

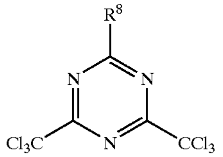

wherein $R^8$ is an aryl group of 6 to 15 carbon atoms, such as, for example, phenyl or naphthyl.

The infrared absorber of the '046 embodiment may have any of the features of the infrared absorber described generally herein. It is preferred that the infrared absorber used fragments upon exposure to the activating radiation. Preferred absorbers are phthalocyanine pigments.

The composition of the '046 embodiment may include terephthaldehyde and/or 3,4,5-trimethoxybenzoic acid.

That concludes the general description of the '046 embodiment.

The present invention may be applied in relation to heat sensitive compositions as described in our non-published patent application GB 97 00877.5 which we hereby call the '877 invention, now taken forward as PCT/GB98/00132. The pages which follow are incorporated from these specifications.

Said heat-sensitive composition may comprise a novolak resin, a condensing agent for the novolak resin, a radiation sensitive latent acid generating compound and an infrared absorbing compound.

Said novolak resin many have any feature of any novolak resin described if any statement herein.

Said infrared absorbing compound and suitable amounts thereof may be as described in any statement herein.

Said condensing agent may be an optionally-substituted polyvinyl phenol compound or a bis-hydroxyalkyl compound.

A preferred polyvinyl phenol compound is a copolymer comprising the following units.

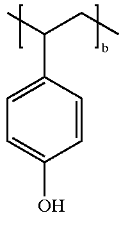

and

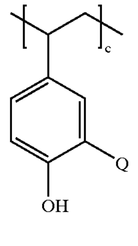

wherein Q represents a hydroxy alkyl group, especially $—CH_2OH$ and b and c independently represent integers.

A preferred bis-hydroxyalkyl compound is a bis-hydroxymethyl compound, with 2,6-bis(hydroxymethyl)-p-cresol being especially preferred.

Said latent acid generating compound may be a latent Bronsted acid, for example as described according to said '046 embodiment.

Preferred latent acid generating compounds are:

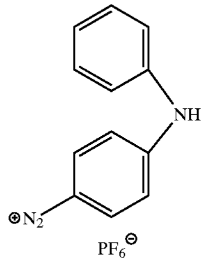

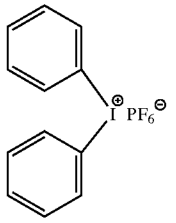

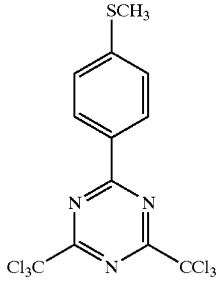

That concludes the general description of the '877 invention.

The present invention may be applied in relation to heat sensitive compositions as described in GB 1 245 924 which we herein call the '924 embodiment.

Said heat sensitive composition may comprise a phenolic resin of the novolak type, optionally in combination with a radiation absorber, preferably a black body absorber, for example a pigment as described herein. Preferred phenolic resins are cresol-formaldehyde resins of the novolak type and phenol-formaldehyde resins of the novolak type. A preferred black body absorber is carbon black.

That concludes the general description of the '924 embodiment.

The present invention may also be applied in relation to heat sensitive compositions as described in U.S. Pat. No. 4,708,925 which we herein call the '925 invention.

Said heat sensitive composition may comprise a phenolic resin and an onium salt. Suitable onium salts include iodonium, sulphonium, bromonium, chloronium, oxysulphonium, sulphoxonium, selenonium, telluronium, phosphonium and arsonium salts. Preferably, an iodonium, sulphonium or oxysulphonium salt is present, most preferably an iodonium salt since it is the most photosensitive and also the easiest to spectrally sensitise.

The onium salt is generally included in the composition in an amount in the range from 1 to 40% weight of the total weight of phenolic resin and onium salt. The amount of onium salt is selected to provide the desired solubility differential between the unexposed and exposed compositions. It has been found that resole resins normally require the onium salt in an amount of at least 5% by weight of the total weight of phenolic resin and onium salt in order to ensure a satisfactory solubility differential. Generally, compositions employing resole resins will include at least 7% by weight of onium salt. It is possible to achieve a satisfactory solubility differential in compositions containing novolak resins containing smaller amounts of onium salt, generally in the range 1 to 40% by weight of onium salt. Further information in these compositions is given in U.S. Pat. No. 4,708,925 and such disclosure is incorporated herein by reference. Suitably, a further components of such compositions is a spectral sensitizer in an amount up to 10% of the composition, selected from one of the following classes diphenylmethane, xanthene, acridine, methine and polymethine (including oxonol, cyanine and merocyanine) dye, thiazole, thiazine azine, aminoketone, porphyrin, coloured aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthiofuran, diarylpyrrole, polyarylphenylene, coumarin and polyaryl-2-pyrazonline.

Said printing member precursor suitably includes a support over which said heat sensitive composition is provided.

Said support may be arranged to be non-ink-accepting when for use in lithographic printing. Said support may have a hydrophilic surface for use in conventional lithographic printing using a fount solution or it may have a release surface suitable for use in waterless printing.

Said support may comprise a metal layer. Preferred metals include aluminium, zinc and titanium, with aluminium being especially preferred. Said support may comprise an alloy of the aforesaid metals. Other alloys that may be used include brass and steel, for example stainless steel.

Said support may comprise a non-metal layer. Preferred non-metal layers include layers of plastics, paper or the like. Preferred plastics include polyester, especially polyethylene terephthalate.

The support may be a semiconductor or, preferably, a conductor in the context of electronic circuitry, and in the context of lithography may be an aluminium plate which has undergone the usual anodic, graining and post-anodic treatments well known in the lithographic art for enabling a radiation sensitive composition to be coated thereon and for the surface of the support to function as a printing background. Another support for use in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated can be used. Another support is a plastics film on which the resist pattern may be provided, to serve as a mask in a later processing step.

Said support may be any type of support usable in printing. For example, it may comprise a cylinder or, preferably, a plate.

Said precursor of said first aspect may be for the manufacture of an electronic part. The types of electronic parts whose manufacture may use a heat sensitive coating include printed wiring boards (PWBs), thick- and thin-film circuits, comprising passive elements such as resistors, capacitors and inductors; multichip devices (MDCs); integrated circuits (ICs); and active semi-conductor devices. The electronic parts may suitably comprise conductors, for example copper board; semi-conductors, for example silicon or germanium; and insulators, for example silica as a surface layer with silicon beneath, with the silica being selectively etched away to expose portions of the silicon beneath (a step in the manufacture of e.g. field effect transistors).

Preferably, said precursor of said first aspect is a heat-sensitive positive working planographic printing member precursor for heat mode imaging.

According to a second aspect of the present invention, there is provided a precursor for preparing a resist pattern by heat mode imaging, the precursor comprising:

a heat sensitive composition, the solubility of which in an aqueous developer is arranged to increase in heated areas, where in said composition comprises an aqueous developer soluble polymeric substance (herein referred to as the "active polymer") and a compound which reduces the aqueous developer solubility of the polymeric substance (herein referred to as the "reversible insolubiliser compound"); and a surfactant;

wherein the aqueous developer solubility of the composition is increased on heating and that the aqueous developer solubility of the composition is not increased by incident UV radiation.

Said active polymer and said reversible insolubiliser compound may have any feature of the active polymer and reversible insolubiliser described with reference to '117 invention. The surfactant may have any feature of the developer resistance means of the first aspect in so far as resistor means which are surfactants are described.

According to a third aspect of the invention, there is provided a method of preparing a precursor which is heat mode imagable to prepare a resist pattern, the method comprising providing over a support a heat sensitive composition and a developer resistance means as described according to said first aspect.

The method may include the step of contacting the support with a said heat sensitive composition, followed by application of a said developer resistance means. Preferably, however, the method includes the step of contacting the support with a said heat sensitive composition and a said developer resistance means substantially at the same time. Preferably, said support is contacted with a formulation, for example a mixture, which comprises a said heat sensitive composition and a said developer resistance means. Such a formulation may also include radiation absorbing means as described herein.

According to a fourth aspect of the invention, there is provided a method of preparing a resist pattern using a precursor according to said first or said second aspects or prepared as described in said third aspect, the method including the step of causing imagewise application of heat to said heat sensitive composition.

The method may include applying heat indirectly by exposure of said precursor to a short duration of high intensity radiation transmitted or reflected from the background areas of a graphic original located in contact with the precursor.

Alternatively, heat may be applied using a heated body, for example, one face of the precursor may be contacted with a heat stylus.

Preferably, the precursor is exposed by means of a laser, thereby to cause heating of said heat sensitive composition. Preferably, said laser emits radiation at above 450 nm, preferably above 500 nm, more preferably above 600 nm, and especially above 700 nm. Most preferably it emits radiation at above 800 nm. Suitably it emits radiation below 1400 nm, preferably below 1200 nm. Examples of lasers which can be used in the method include semi-conductor diode lasers emitting at between 450 and 1400 nm, especially between 600 nm and 1100 nm. An example is an Nd-YAG laser which emits at 1064 nm, but any laser of sufficient imaging power may be used.

The method of the fourth aspect suitably involves the removal, for example by dissolution, of heated areas using a developer which is preferably aqueous and especially alkaline. A preferred developer contains an inorganic or organic metasilicate. Preferably the removal of heat-sensitive composition is complete at those regions, so as to reveal the said surface at those regions, but certain methods, in particular to make certain types of mask, may require the removal of only a proportion of the full depth of the composition where heated, rather than the full depth thereof.

According to a fifth aspect, there is provided a formulation comprising a heat sensitive composition and a developer resistance means, each being as described in any statement herein.

The formulation may include a radiation absorber as described in any statement herein.

According to a sixth aspect, there is provided a kit comprising a plurality of components for making up into a formulation according to said fourth aspect.

According to a seventh aspect, there is provided a printing member which includes image areas (which are suitably ink accepting) which comprise a heat sensitive composition and a developer resistance means each being as described in any statement herein.

Any feature of any aspect of any invention or embodiment described herein may be combined with any feature of any aspect of any other invention or embodiment described herein.

The invention will now be described by way of example.

The following are referred to hereinafter:

Resin A:LB6564—a phenol/cresol novolak resin marketed by Bakelite, UK believed to have the structure:

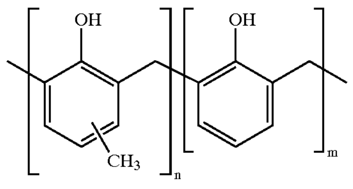

wherein n=m;

Resin B: LB744—a cresol novolak resin marketed by Bakelite, UK believed to have the structure:

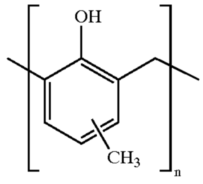

Dye A—KF654B PINA as supplied by Riedel de Haan UK, Middlesex, UK, believed to have the structure:

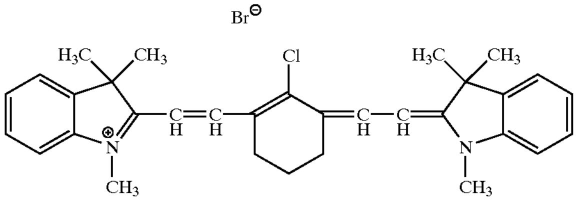

Dye B—crystal violet (basic violet 3,C.I.42555, Gentian Violet) as supplied by Aldrich Chemical Company of Dorset, UK, having the structure:

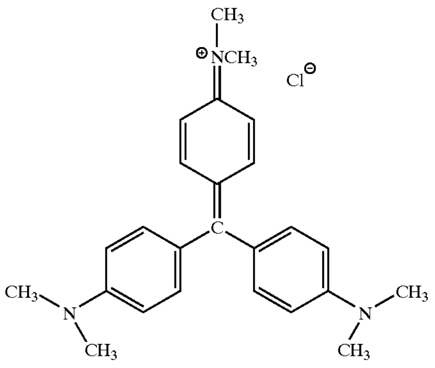

Silikophen P50X—a phenyl methyl siloxane as supplied by Tego Chemie Service GmbH of Essen, Germany.

Montanox 60 DF—a polyethylene glycol 20 sorbitan stearate as supplied by Seppic SA of Paris, France.

Surfacare T20—a polyoxyethylene cetyl stearyl alcohol as supplied by Surfachem of Leeds, UK.

Tegopren 3110—a modified siloxane as supplied by Tego Chemie Service GmbH of Essen, Germany.

Sorbitan monolaurate as supplied by Aldrich Chemical Company of Dorset, UK.

Tween 65—a polyoxyethylene sorbitan stearate as supplied by ICI Europe Ltd, Everslaan 45, Belgium.

Sorbax STS—sorbitan tristearate as supplied by Chemax Inc., Greenville, S.C., USA.

Cirrasol ALN-WF—A polyoxyethylene cetyl stearyl alcohol from ICI Surfactants Ltd, Middlesborough, UK.

Metolat FC 388—a fatty acid polyglycol ester as supplied by Munzing Chemie GmbH of Heibronn, Germany.

Genapol PF80—an ethylene oxide block copolymer from Hoechst AG of Hounslow, UK.

Monolan 8000/E80—an ethylene oxide propylene oxide block copolymer as supplied by Ackros Chemicals of Manchester, UK.

Aldo MLD K FG—glycerol monolaurate as supplied by Lonza of New Jersey, USA.

Renex 30—a polyoxyethylene-12-tridecyl alcohol ethoxylate as supplied by ICI Surfactants Ltd, Middlesborough, UK.

Rewophat E1027—an alkyl phenol polyglycol ether phosphate as supplied by Rewo Chemicals Ltd of Maryport, Cumbria, UK.

Marlowet OFA—an n-alkyl benzene sulfonate, alkyl polyglycol ether, carboxylic acid polyglycolester as supplied by Huls AG of Marl, Germany.

Carbon black FW2—a channel type carbon black obtained from Degussa of Macclesfield, UK.

Resin C: LG724—a phenol novolak resin supplied by Bakelite, UK.

Resin D:—the resin produced when LB6564 (100 g) is reacted with 214-NQD chloride (18 g) by the method of Preparatory Example P2.

214-NQD chloride—the following compound supplied by A. H. Marks of Bradford, UK.

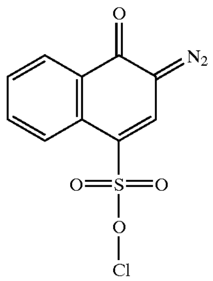

Resin E—Methylol polyvinyl phenol, believed to have the structure:

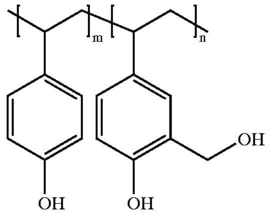

m:n = 77:23

Resin F—Uravar FN6—an alkyl phenolic resole resin as supplied by DSM Resins UK of South Wirral, UK.

Resin G—LB6564 phenolic resin modified by reaction with p-toluene sulfonyl chloride as described in Preparatory Example P1.

Acid Generator A: Diphenyliodonium hexaflourophosphate,

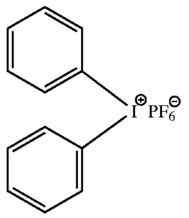

as supplied by Avocado Research Chemicals Ltd of Heysham, Lancashire, UK.

Dye C: SDB7047, having the structure

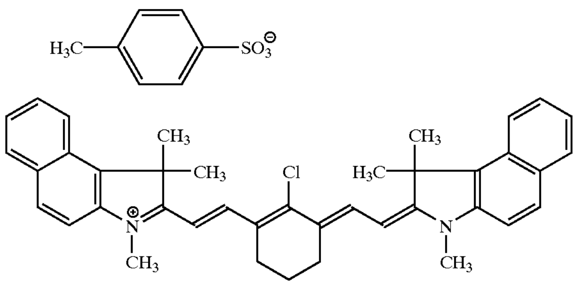

as supplied by H. W. Sands of Jupiter, Fla., USA.

Developer A—14% wt sodium metasilicate pentahydrate in water.

Developer B—7% wt sodium metasilicate pentahydrate in water.

Developer C—3.5% wt sodium metasilicate pentahydrate in water.

Creo Trendsetter—refers to a commercially available (from Creo Products Inc of Burnaby, Canada) image setter, the Trendsetter 3244, using Procomm Plus software, operating at a wavelength of 830 nm at powers of up to 7 W.

Capricorn DH—a positive light sensitive plate supplied by Horsell Graphic Industries of Leeds, England.

Preparatory Example P1 (Preparation of Resin G)

LB6564 (25.0 g) was dissolved in 2-methoxyethanol (61.8 g) and the solution poured into a three-necked 500 ml round-bottomed flask which was immersed in a water bath placed on a hot plate/stirrer arrangement which also included a stirrer gland, stirring rod and thermometer. The solution was stirred rapidly. Distilled water (25.6 g) was slowly added drop wise, keeping precipitation to a minimum. Sodium hydrogen carbonate (4.3 g) was added to the flask, with excess carbonate being undissolved. Next, p-toluene sulfonyl chloride (1.18 g) was added with vigorous stirring. The flask was then warmed with stirring for 6 hours at 40° C. After 6 hours, the flask was removed from the water bath and allowed to cool. Then, a solution was prepared by adding 1.18 s.g. hydrochloric acid (8.6 g) to distilled water (354 g). Next, the esterified resin was added drop wise, with stirring into the dilute hydrochloric acid to slowly precipitate it. The precipitate was filtered and washed by re-slurrying in distilled water three times until the pH of the filtrate reached 6.0. The precipitate was dried in a vacuum oven at 40° C. to give a 75% yield of the desired product, the identity of which was confirmed by IR spectroscopy.

Preparatory Example P2 (Preparation of Resin D)

Resin LB6564 was reacted with 214-NQD in a manner analogous to Example P1 above.

COMPARATIVE EXAMPLE C1 AND EXAMPLES 1 to 14

Coating formulations comprised solutions of the components described in Table 1 (Examples C1 to 14) and Table 2 (Examples 15 to 17), in 1-methoxy propan-2-ol/xylene 98:2(w:w).

The substrate used was 0.3 mm sheet of aluminium that had been electrograined and anodised and post-anodically treated with an aqueous solution of an inorganic phosphate. Plates were prepared by coating the formulations onto the substrate by means of a wire wound bar. The formulation concentrations of Example C1 and 1 to 7 were selected to provide dry films having a coating weight of 2.0 gm$^2$ whereas for Examples 8 to 17 it was 2.5 gm$^2$. The film weights were measured after thorough drying at 100° C. for 3 minutes in a Mathis labdryer oven (as supplied by Werner Mathis AG, Germany).

The plates were then imaged at 7 watts with a 50% screen image using the Creo Trendsetter as described previously. For examples C1 and 1 to 14, imaging energy densities of 140, 180, 220 and 260 mJcm$^{-2}$ were used. For examples 15 to 17, imaging energy densities of 160, 200, 240 and 280 mJcm$^{-2}$ were used. The plates were developed using a Horsell Mercury Mark V plate processor containing developer A at 22° C. Plates were processed at speeds of 500 and 1500 mm min$^{-1}$. Images produced were read using a Tobias plate densitometer as supplied by Tobias Associates Inc of Ivyland, Pa., USA. Finally plates were inked up by hand.

Densitometer readings of 50% screen images exposed by the Creo Trendsetter are provided in Table 3 (Examples C1 and 1 to 14) and Table 4 (Examples 15 to 17).

TABLE 1

| Component | Example C1 | 1 | 2 | 3 | 4 | 5 | 6 | 7 | 8 |
|---|---|---|---|---|---|---|---|---|---|
| | Parts by weight | | | | | | | | |
| Resin A | 73 | 70 | 70 | 71.5 | 70 | 70 | 71.5 | 70 | 70 |
| Resin B | 23 | 20 | 20 | 21.5 | 20 | 20 | 21.5 | 20 | 20 |
| Dye A | 2 | 2 | 2 | 2 | 2 | 2 | 2 | 2 | 2 |
| Dye B | 2 | 2 | 2 | 2 | 2 | 2 | 2 | 2 | 2 |
| Silikophen P50x | | 6 | | | | | | | |
| Montanox 60DF | | | 6 | 3 | | | | | |
| Surfacare T20 | | | | | 6 | | | | |
| Tegopren 3110 | | | | | | 6 | 3 | | |
| Sorbitan monolaurate | | | | | | | | 6 | |
| Tween 65 | | | | | | | | | 6 |

| Component | Example 9 | 10 | 11 | 12 | 13 | 14 |
|---|---|---|---|---|---|---|
| | Parts by weight | | | | | |
| Resin A | 70 | 70 | 70 | 70 | 70 | 70 |
| Resin B | 20 | 20 | 20 | 20 | 20 | 20 |
| Dye A | 2 | 2 | 2 | 2 | 2 | 2 |
| Dye B | 2 | 2 | 2 | 2 | 2 | 2 |
| Sorbax STS | 6 | | | | | |
| Cirrasol ALN-WF | | 6 | | | | |
| Metolat FC 388 | | | 6 | | | |
| Genapol PF80 | | | | 6 | | |
| Monolan 8000/E80 | | | | | 6 | |
| Aldo MLD K FG | | | | | | 6 |

TABLE 2

| Component | Example 15 | 16 | 17 |
|---|---|---|---|
| | Parts by weight | | |
| Resin A | 70 | 70 | 70 |
| Resin B | 20 | 20 | 20 |
| Dye A | 2 | 2 | 2 |
| Dye B | 2 | 2 | 2 |
| Renex 30 | 6 | | |
| Rewophat E1027 | | 6 | |
| Marlowet OFA | | | 6 |

TABLE 3

| Processing | Imaging Energy Density/mJcm$^{-2}$ | | | | | | | |
|---|---|---|---|---|---|---|---|---|
| Speed | 140 | | 180 | | 220 | | 260 | |
| (mm min$^{-1}$) | 500 | 1500 | 500 | 1500 | 500 | 1500 | 500 | 1500 |
| Example C1 | 15% | 30% | 15% | 35% | 11% | 30% | 9% | 20% |
| Example 1 | — | — | 37% | 46% | 39% | 51% | 30% | 47% |
| Example 2 | — | — | 58% | 73% | 53% | 72% | 50% | 67% |
| Example 3 | — | — | 51% | 63% | 47% | 60% | 46% | 58% |
| Example 4 | — | — | 55% | 75% | 51% | 73% | 49% | 68% |
| Example 5 | — | — | 42% | 43% | 47% | 49% | 44% | 49% |
| Example 6 | — | — | 28% | 44% | 26% | 46% | 6% | 45% |
| Example 7 | — | — | 48% | 50% | 45% | 50% | 42% | 50% |
| Example 8 | 80% | 97% | 69% | 93% | 61% | 88% | 56% | 83% |
| Example 9 | 14% | 57% | 14% | 52% | 14% | 49% | 12% | 47% |
| Example 10 | 74% | 97% | 66% | 95% | 60% | 93% | 56% | 90% |
| Example 11 | 88% | 96% | 79% | 94% | 71% | 92% | 65% | 87% |
| Example 12 | 25% | 96% | 76% | 94% | 69% | 90% | 64% | 88% |

TABLE 3-continued

| Processing | Imaging Energy Density/mJcm$^{-2}$ | | | | | | | |
|---|---|---|---|---|---|---|---|---|
| Speed | 140 | | 180 | | 220 | | 260 | |
| (mm min$^{-1}$) | 500 | 1500 | 500 | 1500 | 500 | 1500 | 500 | 1500 |
| Example 13 | 86% | 95% | 79% | 93% | 73% | 89% | 65% | 84% |
| Example 14 | 50% | 89% | 47% | 80% | 47% | 72% | 47% | 64% |

TABLE 4

| Processing | Imaging Energy density/mJcm-2 | | | | | | | |
|---|---|---|---|---|---|---|---|---|
| Speed | 160 | | 200 | | 240 | | 280 | |
| (mm min$^{-1}$) | 500 | 1500 | 500 | 1500 | 500 | 1500 | 500 | 1500 |
| Example 15 | 66% | 93% | 60% | 90% | 56% | 86% | 54% | 80% |
| Example 16 | 31% | 66% | 29% | 58% | 32% | 53% | 38% | 51% |
| Example 17 | 15% | 51% | 15% | 49% | 15% | 47% | 10% | 46% |
| Example C1 | 15% | 34% | 15% | 30% | 12% | 26% | 10% | 24% |

Plates from Examples C1 and 1 to 17 inked up satisfactorily by hand. In addition, the speeds of the plates of Examples 1 to 14 and that of Example C1 were found to be substantially the same (within experimental error).

The results in Tables 3 & 4 show generally that the screen images obtained for Examples 1 to 17 have a greater area than for Example C1—i.e. there is less attack by the developer on the image (non-exposed) areas. Where values of greater than 50% are recorded, this suggests that the amount of the additional component is too high, leading to too great an increase in the insolubility, so that all of the exposed area cannot be removed under the development conditions used.

EXAMPLE C2 AND EXAMPLE 18

Coating formulations for Examples C2 and 18 comprising solutions of the components described in Table 5 were ball-milled together for 24 hours in 1-methoxypropan-2-ol (Example C2) or 1-methoxypropan-2-ol/xylene 98:2 (w:w) (Example 18). The substrate used was as described previously.

The coating solutions were coated onto the substrate by means of a wire wound bar. The solution concentrations were selected to provide the specified dry film compositions with a coating weight of 2.5 $gm^{-2}$ after thorough drying at 100° C. for 3 minutes in a Mathis labdryer over.

TABLE 5

| Component | Example C2 | Example 18 |
|---|---|---|
| | Parts by weight | |
| Carbon Black FW2 | 12 | 12 |
| Resin A | 88 | 82 |
| Silikophen P50X | | 6 |

The plates were then imaged using a rotatable disc apparatus as follows:

A plate was cut into a disc of 105 mm diameter and placed on a rotatable disc that could be rotated at a constant speed of 2500 revolutions per minute. Adjacent to the rotatable disc, a translating table held a laser beam source so that it impinged normal to the disc while the translating table moved the laser beam radially in a linear fashion with respect to the rotatable disc. The exposed image was in the form of a spiral whereby the image in the centre of the spiral represented slow laser scanning speed and long exposure time and the outer edge of the spiral represented fast scanning speed and short exposure time.

The laser used was a single mode 830 nm wavelength 200 mW laser diode which was focused to a 10 micron spot. The laser power supply was a stabilised constant current source.

The exposed plates were developed by immersion in Developer C at 20° C. which removed the imaged coating areas leaving a spiral image. The immersion times required to leave an image having an imaging energy density of 120 mJ $cm^{-2}$ were as described in Table 6.

In addition, plate samples of examples C2 and 18 were tested for developability by immersing in Developer B at 20° C. for an appropriate time. Table 6 lists results of the simple developability tests for the compositions.

TABLE 6

| | Immersion time required/seconds | Time to fully remove coating/seconds |
|---|---|---|
| Example C2 | 7 | 15 |
| Example 18 | 120 | 30 |

EXAMPLE C3 AND EXAMPLE 19

First coating formulations for Examples C3 and 19 comprised carbon black (12 parts by weight) and Resin A (88 parts by weight) which were ball milled together for 24 hours in 1-methoxypropan-2-ol. The substrate used was as described previously. The coating solutions were coated onto the substrate by means of a wire wound bar. The solution concentrations were selected to provide the specified dry film compositions with a coating weight of 2.5 $gm^{-2}$ after thorough drying at 100° C. for 3 minutes in a Mathis labdryer oven.

A second coating formulation comprising Silikophen P50X at 3% (w:w) in xylene was applied, by means of the same wire wound bar, over the first coating of the arrangement of Example 19 described above. The solution concentration was selected to provide a second dry film coating weight of 0.3 $gm^{-2}$ after thorough drying at 130° C. for 80 seconds in the Mathis labdryer oven. The first coating of the arrangement of Example C3 was not covered with a second coat but was subjected to additional stoving at 130° C. for 80 seconds in the Mathis oven.

The plates were then imaged using the rotating disc apparatus described above with reference to Examples C2 and 18. The exposed plates were developed by immersing in developer C at 20° C. which removed the imaged coating areas leaving a spiral image. The immersion times required to leave an image having an imaging energy density of 120 $mJcm^{-2}$ were as described in Table 7.

In addition, plate samples of examples C3 and 19 were tested for developability by immersing in developer B at 20° C. for an appropriate time. Table 7 lists results of the simple developability tests for the compositions.

TABLE 7

| | Immersion time required/seconds | Time to fully remove coating/seconds |
|---|---|---|
| Example C3 | 7 | 15 |
| Example 19 | >60 | 120 |

EXAMPLE C4 AND EXAMPLE C20

Coating formulations for the examples comprised the components described in Table 8 in 1-methoxypropan-2-ol (Example C4) and 1-methoxypropan-2-ol/xylene 98:2 (w:w) (Example 20). A substrate was coated as described previously to give a dry coating weight of 2.5 $gm^{-2}$ after drying at 100° C. for 3 minutes in the Mathis oven.

TABLE 8

| Component | Example C4 | Example 20 |
|---|---|---|
| | Parts by weight | |
| Resin C | 20 | 20 |
| Dye A | 2 | 2 |
| Dye B | 2 | 2 |
| Resin D | 76 | 70 |
| Silikophen P50X | | 6 |

The plates were then imaged using the rotating disc apparatus as described previously. The exposed plates were developed by immersing in developer B at 20° C. which removed the imaged coating areas leaving a spiral image. The immersion time required to leave an image having an imaging energy density of 120 $mJcm^{-2}$ were as described in Table 9. In addition, plate samples of examples C4 to 20 were tested for developability by immersing in developer A at 35° C. for an appropriate time. Table 9 lists results of the simple developability tests for the compositions.

TABLE 9

| | Immersion time required/seconds | Time to fully remove coating/seconds |
|---|---|---|
| Example C4 | 30 | 15 |
| Example 20 | 40 | 25 |

EXAMPLE C5 AND EXAMPLE 21

Coating formulations for the examples comprised the components described in Table 10 in 1-methoxypropon-2-ol/dimethylformamide 50:50 (w:w) (Example C5) and 1-methoxypropan-2-ol/dimethylformamide/xylene 49:49:2 (w:w:w) (Example 21). Substrates were coated as described previously to give a dry coating weight of 1.2 $gm^{-2}$ after drying at 100° C. for 3 minutes in the Mathis oven.

TABLE 10

| | Example | |
|---|---|---|
| Component | C5 Parts by weight | 21 |
| Resin A | 42 | 39 |
| Resin E | 42 | 39 |
| Acid Generator A | 12 | 12 |
| Dye C | 4 | 4 |
| Silikophen P50X | | 6 |

The plates were then imaged using the rotating disc apparatus described above with reference to Examples C2 and 18. The exposed plates were developed by immersing in developer B at 20° C. which removed the imaged coating areas leaving a spiral image. The immersion times required to leave an image having an imaging energy density of 120 $mJcm^{-2}$ were as described in Table 11.

In addition, plate samples of examples C5 and 21 were tested for developability by immersing in developer A at 20° C. for an appropriate time. Table 11 lists results of the simple developability tests for the compositions.

TABLE 11

| | Immersion time required/seconds | Time to fully remove coating/ seconds |
|---|---|---|
| Example C5 | 30 | 3 |
| Example 21 | 60 | 35 |

EXAMPLES C6 AND EXAMPLE 22

Coating formulations for the examples comprised the components described in Table 12 in 1-methoxypropan-2-ol/dimethylformamide 50:50 (w:w) (Example C6) and 1-methoxypropan-2-ol/dimethylformamide/xylene49:49:2 (w:w:w) (Example 22). Substrates were coated as described previously to give a dry coating weight of 1.2 $gm^{-2}$ after drying at 100° C. for 3 minutes in the Mathis oven.

TABLE 12

| | Example | |
|---|---|---|
| Components | C6 Parts by Weight | 22 |
| Resin A | 42 | 39 |
| Resin F | 42 | 9 |
| Acid Generator A | 12 | 12 |
| Dye C | 4 | 4 |
| Silikophen P50X | | 6 |

The plates were then imaged using the rotating disc apparatus as described above. The exposed plates were developed by immersion in developer A at 20° C. which removed the imaged coating areas leaving a spiral image. The immersion times required to leave an image having an imaging energy density of 120 $mJcm^{-2}$ were as described in Table 13.

In addition, plate samples of examples C6 and 22 were tested for developability by immersing in developer A at 35° C. for an appropriate time. The following table lists results of the simple developability tests for the compositions.

TABLE 13

| | Immersion time required/seconds | Time to fully remove coating/seconds |
|---|---|---|
| Example C6 | 60 | 90 |
| Example 22 | >300 | 120 |

EXAMPLES C7 AND EXAMPLE 23

Coating formulations for the examples comprised the components described in Table 14 in 1-methoxypropan-2-ol (Example C7) and 1-methoxypropan-2-ol/xylene 98:2 (w:w). Substrates were coated as described previously to give a dry coating weight of 2.0 $gm^{-2}$ after thorough drying at 100° C. for 3 minutes in the Mathis oven.

TABLE 14

| | Example | |
|---|---|---|
| Component | C7 Parts by Weight | 23 |
| Resin G | 100 | 95 |
| Silikophen P50X | | 5 |

Plate samples were tested for developability by immersing in developer A at 20° C. for an appropriate time. Results are provided in Table 15. The coated plates were one day old when tested.

TABLE 15

| | Time to fully remove coating/seconds |
|---|---|
| Example C7 | 15 |
| Example 23 | 30 |

EXAMPLE 24

The relative rates of removal of 2 $gm^{-2}$ coatings of Examples C1, 1 and Capricorn DH was assessed by immersing plates in Developer A at 20° C. and measuring the time taken for removal of all of the coating. Results are provided in Table 16.

TABLE 16

| Example No. | Time for Removal |
|---|---|
| C1 | 6 minutes |
| 1 | 11 minutes |
| Capricorn DH | >65 minutes |

The results illustrate how the additive of Example 1 provides a substantial increase in developer resistance compared to C1. Additionally, the relatively insoluble nature of commercially available light sensitive (as opposed to heat mode) plates is illustrated by Capricorn DH and, it will be appreciated, confirms that there is no need to take steps to increase insolubility for such plates.

In the specification we refer in various places to UV, infra-red and visible radiation. A person skilled in the art will be aware of the typical wavelength ranges of these radiations. However, for the avoidance of any doubt, UV radiation typically has a wavelength range not exceeding about 450 nm (by which we mean insubstantial above 450 nm). Visible radiation has a wavelength range of about 400 to 700 nm. Infra-red radiation typically has a wavelength range in excess of 600 nm, the boundaries between UV and visible radiation, and between infra-red and visible radiation, not being sharp ones.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A precursor for preparing a resist pattern by heat mode imaging, the precursor comprising a heat sensitive composition, the solubility of which in an aqueous alkaline developer is arranged to increase in heated areas, and a developer resistance means for increasing the resistance of non-heated areas of the heat sensitive composition to dissolution in an aqueous alkaline developer, wherein said developer resistance means comprises a siloxane, wherein the amount of the siloxane is between 3% by weight and 10% by weight and wherein said heat-sensitive composition comprises an active polymer which is an aqueous alkaline developer soluble polymeric substance and a reversible insolubiliser compound which reduces the aqueous alkaline developer solubility of the polymeric substance such that the aqueous alkaline developer solubility of the composition is increased on heating and the aqueous alkaline developer solubility of the composition is not increased by incident UV radiation.

2. A precursor according to claim 1, wherein said developer resistance means is non-ionic.

3. A precursor according to claim 1, wherein said developer resistance means includes a unit of formula $$[-C_rH_{2r}-O-]_y \qquad \text{I}$$

wherein r is an integer in the range 2 to 5 and y is an integer in the range 2 to 5,000.

4. A precursor according to claim 1, wherein said developer resistance means comprises a siloxane substituted by one or more optionally-substituted alkyl or phenyl groups.

5. A precursor according to claim 1, wherein said developer resistance means is selected from a phenylalkylsiloxane and a dialkylsiloxane.

6. A precursor according to claim 1, wherein said heat sensitive composition comprises a phenolic resin.

7. A polymer according to claim 1, wherein said active polymer includes one or more functional groups selected from hydroxy, carboxylic acid, amino, amide and maleimide functional groups.

8. A precursor according to claim 1, wherein said active polymer is a phenolic resin.

9. A precursor according to claim 1, wherein said reversible insolubiliser compound is nitrogen containing and at least one nitrogen atom is selected from the group consisting of quarternarized nitrogen atoms, nitrogen atoms incorporated in a heterocyclic ring, and quarternarized nitrogen atoms that are incorporated in a heterocyclic ring.

10. A precursor according to claim 1, wherein said reversible insolubiliser compound contains a carbonyl functional group.

11. A precursor according to claim 10, where a compound containing a carbonyl group may be selected from α-naphthoflavone, β-naphthoflavone, 2,3-diphenyl-1-indeneone, flavone, flavanone, xanthone, benzophenone, N-(4-bromobutyl)phthalimide and phenanthrenequinone.

12. A precursor according to claim 1, wherein said reversible aqueous insolubiliser compound is a compound of general formula $$Q_1—S(O)_a—Q_2$$

where $Q_1$ represents an optionally substituted phenyl or alkyl group, a represents 0, 1, or 2, and $Q_2$ represents a halogen atom or an alkoxy group.

13. A precursor according to claim 1, wherein said reversible aqueous insolubiliser compound is acridine orange base.

14. A precursor according to claim 1, wherein said reversible aqueous insolubiliser compound is a ferrocenium compound.

15. A precursor according to claim 1, wherein said heat-sensitive composition comprises a novolak resin, a condensing agent for the novolak resin and a radiation sensitive latent acid generating compound.

16. A precursor according to claim 15, wherein said condensing agent is an optionally-substituted polyvinyl phenol compound or a bis-hydroxyalkyl compound.

17. A precursor according to claim 1, which includes a layer which includes a radiation absorbing compound or a combination of such compounds.

18. A precursor according to claim 17, wherein said radiation absorbing compound is arranged to convert radiation to heat.

19. A precursor according to claim 17, wherein said radiation absorbing compound is a pigment or dye.

20. A precursor according to claim 1, which precursor is for manufacturing an electronic part.

21. A precursor according to claim 1, which precursor is a heat-sensitive positive working planographic printing member precursor for heat mode imaging.

22. A precursor according to claim 1, wherein said heat-sensitive composition comprises a polymeric substance having functional groups Q thereon, such that the functionalised polymeric substance has the property that it is developer insoluble prior to delivery of radiation and developer soluble thereafter, wherein the functional groups Q do not comprise acid groups or acid generating groups, in each case protected by labile protective groups removed on exposure to said radiation.

23. A precursor according to claim 1, wherein said heat-sensitive composition comprises a polymeric substance and diazide moieties, wherein the said composition has the property that it is developer insoluble prior to delivery of said radiation and developer soluble thereafter, wherein said radiation is entirely or predominantly direct heat radiation or electromagnetic radiation of wavelength exceeding 500 nm.

24. A method of preparing a resist pattern using a precursor according to claim 1, the method including the step of causing imagewise application of heat to said heat sensitive composition.

25. A precursor for preparing a heat pattern by heat mode imaging, the precursor comprising a heat sensitive composition, the solubility of which in an aqueous alkaline developer is arranged to increase in heated areas, wherein said composition comprises a developer resistance means for increasing the resistance of non-heated areas of the heat sensitive composition to dissolution in an aqueous alkaline developer, wherein said developer resistance means comprises a siloxane, an active polymer which is an aqueous alkaline developer soluble polymeric substance, a reversible insolubiliser compound which reduces the aqueous alkaline developer solubility of the polymeric substance and a surfactant, wherein the amount of surfactant is between 3% by weight and 10% by weight, such that the aqueous alkaline developer solubility of the composition is increased on heating and the aqueous alkaline developer solubility of the composition is not increased by incident UV radiation.

26. A method of preparing a precursor which is heat mode imageable to prepare a resist pattern, the method comprising providing over support a heat sensitive composition, the solubility of which is arranged to increase in heated areas and a developer resistance means for increasing the resistance of non-heated areas of the heat sensitive composition to dissolution in an aqueous alkaline developer, wherein said developer resistance means comprises a siloxane, wherein the amount of the siloxane is between 3% by weight and 10% by weight and wherein said heat-sensitive composition comprises an active polymer which is an aqueous alkaline developer soluble polymeric substance and a reversible insolubiliser compound which reduces the aqueous alkaline developer solubility of the polymeric substance such that the aqueous alkaline developer solubility of the composition is increased on heating and the aqueous alkaline developer solubility of the composition is not increased by incident UV radiation.

27. A formulation comprising a heat sensitive composition, the solubility of which in an aqueous alkaline developer is arranged to increase when heated and a developer resistance means for increasing the resistance of non-heated areas of the heat sensitive composition to dissolution in an aqueous alkaline developer, wherein said developer resistance means comprises a siloxane, wherein the amount of the siloxane is between 3% by weight and 10% by weight and wherein said heat-sensitive composition comprises an active polymer which is an aqueous alkaline developer soluble polymeric substance and a reversible insolubiliser compound which reduces the aqueous alkaline developer solubility of the polymeric substance such that the aqueous alkaline developer solubility of the composition is increased on heating and the aqueous alkaline developer solubility of the composition is not increased by incident UV radiation.

28. A kit for making up into a formulation according to claim 27.

29. A printing member which includes ink accepting image areas which comprises a heat sensitive composition, the solubility of which in an aqueous alkaline developer is arranged to increase in heated areas and a developer resistance means for increasing the resistance of non-heated areas of the heat sensitive composition to dissolution in an aqueous alkaline developer, wherein said developer resistance means comprises a siloxane, wherein the amount of the siloxane is between 3% by weight and 10% by weight and wherein said heat-sensitive composition comprises an active polymer which is an aqueous alkaline developer soluble polymeric substance and a reversible insolubiliser compound which reduces the aqueous alkaline developer solubility of the polymeric substance such that the aqueous alkaline developer solubility of the composition is increased on heating and the aqueous alkaline developer solubility of the composition is not increased by incident UV radiation.

30. A precursor for preparing a resist pattern by heat mode imaging, the precursor comprising a heat sensitive composition, the solubility of which in an aqueous developer is arranged to increase in heated areas, and a developer resistance means for increasing the resistance of non-heated areas of the heat sensitive composition to dissolution in an aqueous developer, wherein said developer resistance means comprises a siloxane substituted by one or more optionally-substituted alkyl or phenyl groups, wherein the amount of siloxane is between 3% by weight and 10% by weight.

31. The precursor of claim 30, wherein said developer resistance means is selected from the group consisting of a phenylalkysiloxane and a dialkylsiloxane.

32. A precursor for preparing a resist pattern by heat mode imaging, the precursor comprising a heat sensitive composition, the solubility of which in an aqueous developer is arranged to increase in heated areas, and a developer resistance means for increasing the resistance of non-heated areas of the heat sensitive composition to dissolution in an aqueous developer, wherein said developer resistance means comprises a siloxane, wherein the amount of the siloxane is between 3% by weight and 10% by weight and wherein said heat-sensitive composition comprises an active polymer which is an aqueous developer soluble polymeric substance and a reversible insolubiliser compound which reduces the aqueous developer solubility of the polymeric substance such that the aqueous developer solubility of the composition is increased on heating and the aqueous developer solubility of the composition is not increased by incident UV radiation and said reversible insolubiliser compound is selected from the group consisting of α-naphthoflavone, β-naphthoflavone, 2,3-diphenyl-1-indeneone, flavone, flavanone, xanthone, benzophenone, N-(4-bromobutylphthalimide) and phenanthrenequinone.

33. A precursor for preparing a resist pattern by heat mode imaging, the precursor comprising a heat sensitive composition, the solubility of which in an aqueous developer is arranged to increase in heated areas, and a developer resistance means for increasing the resistance of non-heated areas of the heat sensitive composition to dissolution in an aqueous developer, wherein said developer resistance means comprises a siloxane, wherein the amount of the siloxane is between 3% by weight and 10% by weight and wherein said heat-sensitive composition comprises an active polymer which is an aqueous developer soluble polymeric substance and a reversible insolubiliser compound which reduces the aqueous developer solubility of the polymeric substance such that the aqueous developer solubility of the composition is increased on heating and the aqueous developer solubility of the composition is not increased by incident UV radiation, wherein said reversible insolubiliser compound is a compound of general formula $$Q_1\text{—}S(O)_a\text{—}Q_2$$

where $Q_1$ represents an optionally substituted phenyl or alkyl group, a represents 0, 1, or 2, and $Q_2$ represents a halogen atom or an alkoxy group.

34. A precursor for preparing a resist pattern by heat mode imaging, the precursor comprising a heat sensitive composition, the solubility of which in an aqueous developer is arranged to increase in heated areas, and a developer resistance means for increasing the resistance of non-heated areas of the heat sensitive composition to dissolution in an aqueous developer, wherein said developer resistance means comprises a siloxane, wherein the amount of the siloxane is between 3% by weight and 10% by weight and wherein said heat-sensitive composition comprises an active polymer which is an aqueous developer soluble polymeric substance and a reversible insolubiliser compound which reduces the aqueous developer solubility of the polymeric substance such that the aqueous developer solubility of the composition is increased on heating and the aqueous developer solubility of the composition is not increased by incident UV radiation, wherein said reversible insolubiliser compound is acridine orange base.

35. A precursor for preparing a resist pattern by heat mode imaging, the precursor comprising a heat sensitive composition, the solubility of which in an aqueous developer is arranged to increase in heated areas, and a developer resistance means for increasing the resistance of non-heated areas of the heat sensitive composition to dissolution in an aqueous developer, wherein said developer resistance means comprises a siloxane, wherein the amount of the siloxane is between 3% by weight and 10% by weight and wherein said heat-sensitive composition comprises an active polymer which is an aqueous developer soluble polymeric substance and a reversible insolubiliser compound which reduces the aqueous developer solubility of the polymeric substance such that the aqueous developer solubility of the composition is increased on heating and the aqueous developer solubility of the composition is not increased by incident UV radiation, wherein said reversible aqueous insolubiliser compound is a ferrocenium compound.

36. A precursor for preparing a resist pattern by heat mode imaging, the precursor comprising a heat sensitive composition, the solubility of which in an aqueous alkaline developer is arranged to increase in heated areas, and a composition lacking acid labile groups comprising a siloxane, wherein the amount of the siloxane is between 3% by weight and 10% by weight and wherein said heat-sensitive composition comprises an active polymer which is an aqueous alkaline developer soluble polymeric substance and a reversible insolubiliser compound which reduces the aqueous alkaline developer solubility of the polymeric substance such that the aqueous alkaline developer solubility of the composition is increased on heating and the aqueous alkaline developer solubility of the composition is not increased by incident UV radiation.

37. The precursor of claim 36, wherein said composition lacking acid labile groups does not produce an acid on heat mode imaging.

38. The precursor of claim 36, wherein said composition lacking acid labile groups is non-ionic.

39. The precursor of claim 36, wherein said composition lacking acid labile groups is a surfactant.

* * * * *